(12) United States Patent
Hersam et al.

(10) Patent No.: US 10,280,317 B2
(45) Date of Patent: May 7, 2019

(54) ENHANCED CONDUCTIVITY, ADHESION AND ENVIRONMENTAL STABILITY OF PRINTED GRAPHENE INKS WITH NITROCELLULOSE

(71) Applicant: Northwestern University, Evanston, IL (US)

(72) Inventors: Mark C. Hersam, Wilmette, IL (US); Ethan B. Secor, Evanston, IL (US); Theodore Z. Gao, Evanston, IL (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 0 days.

(21) Appl. No.: 15/644,326

(22) Filed: Jul. 7, 2017

(65) Prior Publication Data

US 2018/0010001 A1    Jan. 11, 2018

Related U.S. Application Data

(60) Provisional application No. 62/359,583, filed on Jul. 7, 2016.

(51) Int. Cl.
| | |
|---|---|
| *C09D 11/037* | (2014.01) |
| *B41J 2/01* | (2006.01) |
| *C09D 11/322* | (2014.01) |
| *C09D 11/36* | (2014.01) |
| *B05D 1/02* | (2006.01) |
| *H05K 1/00* | (2006.01) |
| *C09D 11/14* | (2006.01) |
| *C09D 11/52* | (2014.01) |

(52) U.S. Cl.
CPC ............. *C09D 11/037* (2013.01); *B05D 1/02* (2013.01); *B41J 2/01* (2013.01); *C09D 11/14* (2013.01); *C09D 11/322* (2013.01); *C09D 11/36* (2013.01); *C09D 11/52* (2013.01); *H05K 1/00* (2013.01)

(58) Field of Classification Search
CPC ..... C09D 11/36; C09D 11/322; C09D 11/037; B05D 1/02; B41J 2/01
USPC ........................................................ 347/100
See application file for complete search history.

(56) References Cited

U.S. PATENT DOCUMENTS

| | | | |
|---|---|---|---|
| 9,079,764 B1 | 7/2015 | Hersam et al. | |
| 2012/0277360 A1 | 11/2012 | Scheffer et al. | |
| 2015/0072162 A1 | 3/2015 | Hersam et al. | |
| 2015/0307730 A1 | 10/2015 | Hersam et al. | |
| 2016/0115293 A1 | 4/2016 | Aksay et al. | |

(Continued)

FOREIGN PATENT DOCUMENTS

| | | |
|---|---|---|
| CN | 103113786 A | 5/2013 |
| WO | 2013074712 A1 | 5/2013 |

OTHER PUBLICATIONS

Li, L. et al., "High-Performance Solid-State Supercapacitors and Microsupercapacitors Derived from Printable Graphene Inks", Adv. Energy Mater., 2016.

(Continued)

*Primary Examiner* — Huan H Tran
*Assistant Examiner* — Alexander D Shenderov
(74) *Attorney, Agent, or Firm* — Locke Lord LLP; Tim Tingkang Xia, Esq.

(57) ABSTRACT

Graphene ink compositions comprising nitrocellulose and related methods of use comprising either thermal or photonic annealing.

41 Claims, 36 Drawing Sheets
(29 of 36 Drawing Sheet(s) Filed in Color)

(56) References Cited

U.S. PATENT DOCUMENTS

2016/0134327 A1* 5/2016 Joshi .................. H04B 1/707
                                                    375/146
2017/0081537 A1  3/2017 Hersam et al.
2018/0030289 A1* 2/2018 Jarvis ................ C09D 11/037

OTHER PUBLICATIONS

International Search Report and Written Opinion for PCT/US2017/041192 dated May 4, 2018, 13 pages.

* cited by examiner

Spray coating  Inkjet printing  Blade coating

ENHANCED CONDUCTIVITY, ADHESION AND ENVIRONMENTAL STABILITY OF PRINTED GRAPHENE INKS WITH NITROCELLULOSE

This application claims priority to and the benefit of application Ser. No. 62/359,583 filed Jul. 7, 2016, the entirety of which is incorporated herein by reference.

This invention was made with government support under FA8650-15-2-5518 awarded by the Air Force Materiel Command Legal Office (AFMCLO/JAZ) and N00014-11-1-0690 awarded by the Office of Naval Research; and DMR-1121262 awarded by the National Science Foundation. The government has certain rights in the invention.

BACKGROUND OF THE INVENTION

Flexible printed electronics represent an emerging technology with potentially broad impact on everyday life. Printed devices such as environmental, physical, and biological sensors, logic circuits, radio-frequency transmitters, and display elements can enable a variety of applications in portable electronics, cybersecurity, biomedical diagnostics, and the Internet of Things. A cornerstone of this vision is the ability to integrate high-performance electronically functional materials in a low-cost, high-throughput, versatile manufacturing platform. Solution-phase printing methods such as inkjet, gravure, flexographic, and screen printing are well-suited for this purpose, offering high resolution patterning of liquid inks in a scalable manner. The development of inks based on electronic materials is therefore critical to progress in this field. Conductive nanomaterials have attracted significant interest in this regard, offering excellent electronic properties and compatibility with liquid-phase processing. In particular, recent efforts have focused on the application of graphene inks in flexible printed electronics, due to graphene's desirable combination of electrical and thermal conductivity, mechanical flexibility, chemical and thermal stability, and earth abundance.

The unique properties of graphene establish it as a promising alternative to traditional printed conductors, such as metallic nanoparticles and conductive polymers. Thus far, graphene inks have been demonstrated for a range of applications including flexible interconnects, transistor channels and electrodes, transparent conductors, and supercapacitors. Although initial work in this field focused on graphene oxide and its chemical derivatives, recent research has demonstrated dispersion and patterning strategies for pristine, non-oxidized graphene for high-performance applications. Despite these important advances, graphene inks that concurrently offer high electrical conductivity, strong substrate adhesion, and robust environmental stability have not been previously demonstrated.

SUMMARY OF THE INVENTION

In light of the foregoing, it is an object of the present invention to provide methods relating to the preparation of concentrated graphene media, together with corresponding ink compositions and composites available therefrom, thereby overcoming various deficiencies and shortcomings of the prior art, including those outlined above. It will be understood by those skilled in the art that one or more aspects of this invention can meet certain objectives, while one or more aspects can meet certain other objectives. Each objective may not apply equally, in all its respects, to every aspect of this invention. As such, the following objects can be viewed in the alternative, with respect to any one aspect of this invention.

It can also be an object of the present invention to provide a rapid, scalable methodology for preparation of highly-concentrated graphene media without impractical, time-inefficient, excessively-long sonication and/or centrifugation procedures.

It can be an object of the present invention to provide an economical, efficient approach to the preparation of graphene solutions, dispersions and related graphene ink compositions, using low-cost organic solvents, such compositions at concentrations sufficient, and surface tension and viscosity tunable, for a range of end-use applications.

It can also be an object of the present invention, alone or in conjunction with one or more of the preceding objectives, to provide a low temperature, environmentally benign approach to stable graphene ink printing en route to the fabrication of high-conductivity patterns suitable for flexible or foldable electronics.

Other objects, features, benefits and advantages of the present invention will be apparent from the summary and the following descriptions of certain embodiments, and will be readily apparent to those skilled in the art having knowledge of various graphene preparation methods and graphene ink printing applications. Such objects, features, benefits and advantages will be apparent from the above as taken in conjunction with the accompanying examples, data, figures and all reasonable inferences to be drawn therefrom.

In part, the present invention can be directed to a method of graphene ink deposition. Such a method can comprise providing a graphene ink composition comprising graphene, a nitrocellulose and an ink solvent; depositing such a graphene ink composition on a substrate; and annealing such a deposited graphene ink composition, such a graphene ink annealation product as can comprise graphene and amorphous carbon.

Without limitation as to identity of an organic solvent and/or a cellulosic dispersing agent, an ink solvent component can be selected from various fluid components at least partially miscible with an aforementioned organic solvent component. Regardless, such ink solvent components can include, without limitation, $C_2$-about $C_8$ alkyl esters (e.g., without limitation, ethyl lactate and octyl acetate), alkylene glycols (e.g., ethylene glycol) and glycol ethers (e.g., di(ethylene glycol) methyl ether) and acetate esters thereof and ketones (e.g., acetone) and combinations thereof, optionally together with compositions comprising one or more suitable co-dispersants. Such solvent components are limited only by functional capacity to solubilize such a graphene/cellulosic polymer and afford a resulting fluid composition having a concentration, viscosity, surface tension and/or drying profile, whereby a corresponding ink composition can be tailored or tuned for a specific deposition technique.

As illustrated elsewhere herein, graphene ink deposition can be selected from but is not limited to inkjet printing, spray coating and blade coating, and such an ink solvent can be selected for such a deposition. In certain embodiments, without limitation, the deposition can be by inkjet printing, and such an ink solvent can comprise methyl lactate, octyl lactate and ethylene glycol diacetate. In certain other embodiments, without limitation, deposition can be by spray coating, and such an ink solvent can comprise acetone and ethyl lactate. In yet other embodiments, without limitation, deposition can be by blade coating, and such an ink solvent can comprise ethyl lactate. Regardless, a corresponding graphene ink composition can be applied to, deposited and/or printed on a suitable substrate, including without limitation a flexible polymeric substrate. In certain embodiments, where such a graphene ink composition is photonically annealed, such a substrate can be selected from glass, metal, metal oxide, paper and flexible polymeric substrates, as well as various other substrates known to those skilled in the art made aware of this invention.

Regardless, preparation of a graphene ink composition can comprise exfoliating graphene from a graphene source material with a medium comprising an organic solvent at least partially miscible in water, and a nitrocellulose polymer; contacting at least a portion of such an exfoliated graphene medium with an aqueous (e.g., without limitation, an aqueous NaCl solution) medium to concentrate exfoliated graphene and nitrocellulose; isolating a solid graphene and nitrocellulose composition, and contacting such a solid composition with an ink solvent component. In certain non-limiting embodiments, exfoliating a graphene source material can comprise or can be achieved by shear mixing such a material and such a medium. In certain other non-limiting embodiments, such an organic solvent can be selected from suitable alcohols, esters, amides, ethers, and ketones and combinations thereof, such a solvent as can at least partially solubilize such a nitrocellulose dispersing agent. In certain such embodiments, such a solvent can comprise ethanol or acetone.

In part, the present invention can also be directed to a method of using nitrocellulose to affect, modulate, maintain and/or adjust properties of a graphene ink printed on a substrate. Such a method can comprise providing a graphene ink composition comprising graphene, a nitrocellulose and an ink solvent; printing such an ink composition on a substrate; and annealing such a printed graphene ink composition to decompose nitrocellulose, thereby providing amorphous carbon and affecting, modulating, maintaining and/or adjusting mechanical and conductive properties of a resulting graphene ink print. In certain non-limiting embodiments, amorphous carbon can modulate coupling of graphene flakes. In certain other embodiments, amorphous carbon can modulate adhesion of graphene ink print to such a substrate. As discussed above and illustrated elsewhere herein, such a graphene ink composition can be printed on a flexible polymeric substrate.

As a separate consideration, such an ink solvent can comprise a component selected from but not limited to solvents of the sort discussed above or illustrated elsewhere herein. Regardless, such a graphene ink composition can be annealed at a temperature of about 200° C. to about 350° C. In certain such embodiments, graphene ink print can be annealed to 200° C.

With respect to various other non-limiting embodiments, such a deposited graphene ink composition can be photonically annealed. In certain embodiments, photonic annealing can increase the surface area of such a graphene ink print. In certain such embodiments, such a print can comprise a porous morphology. In various other non-limiting embodiments, such a substrate can be of a microsupercapacitor device, and printing provides interdigitated graphene electrodes thereon. In certain embodiments, photonic annealing can increase capacitance of such a device. In certain such embodiments, capacitance of such a device can increase with increasing thickness dimension of such a graphene ink print.

Accordingly, the present invention can also be directed to an ink composition comprising graphene, a fluid ink solvent component and a nitrocellulose. In various embodiments, such a fluid component can comprise a solvent selected from alkyl acetates, alkyl lactates, alkylene glycols and ethers and acetate esters thereof, as discussed above and described elsewhere herein. In certain such embodiments, such a fluid component can comprise a combination of such solvents. Thermal or photonic annealing can provide such a composition comprising a decomposition product of nitrocellulose.

Regardless, an ink composition of this invention can comprise a graphene concentration of up to or greater than about 5 mg/ml. In certain non-limiting embodiments, such a composition can comprise a graphene concentration of about 1 mg/ml to about 80 mg/ml. As a separate consideration, such a composition can comprise a nitrocellulose concentration of about 5 mg/ml to about 15 mg/ml. Without limitation as to any particular graphene concentration, such a composition can comprise dense, over-lapping, few layer, unagglomerated graphene flakes, such a morphology as can be evidenced by scanning electron and atomic force microscopy and characterized using techniques of the sort discussed herein. Regardless, in certain embodiments, such a composition can be printed or patterned on a substrate and annealed, providing such a printed composition a conductivity on the order of $10^4$ S/m.

The present invention can, in part, be directed to a composite comprising such a graphene ink composition coupled to a substrate of the sort discussed above or illustrated elsewhere herein, including without limitation a flexible or foldable polymeric substrate component, such a graphene composition as can be inkjet printed, spray coated or blade coated thereon. Such a composition can be considered as comprising graphene and amorphous carbon, a thermal or photonic annealation/decomposition product of nitrocellulose-stabilized graphene. Regardless, with respect to such an ink composition, print morphology, electrical performance and mechanical properties can be substantially maintained through environmental stress and over repeated substrate bending or folding.

BRIEF DESCRIPTION OF THE DRAWINGS

The patent or application file contains at least one drawing executed in color. Copies of this patent or patent application publication with color drawing(s) will be provided by the office upon request and payment of the necessary fee.

DETAILED DESCRIPTION OF CERTAIN EMBODIMENTS

Figure 1A:
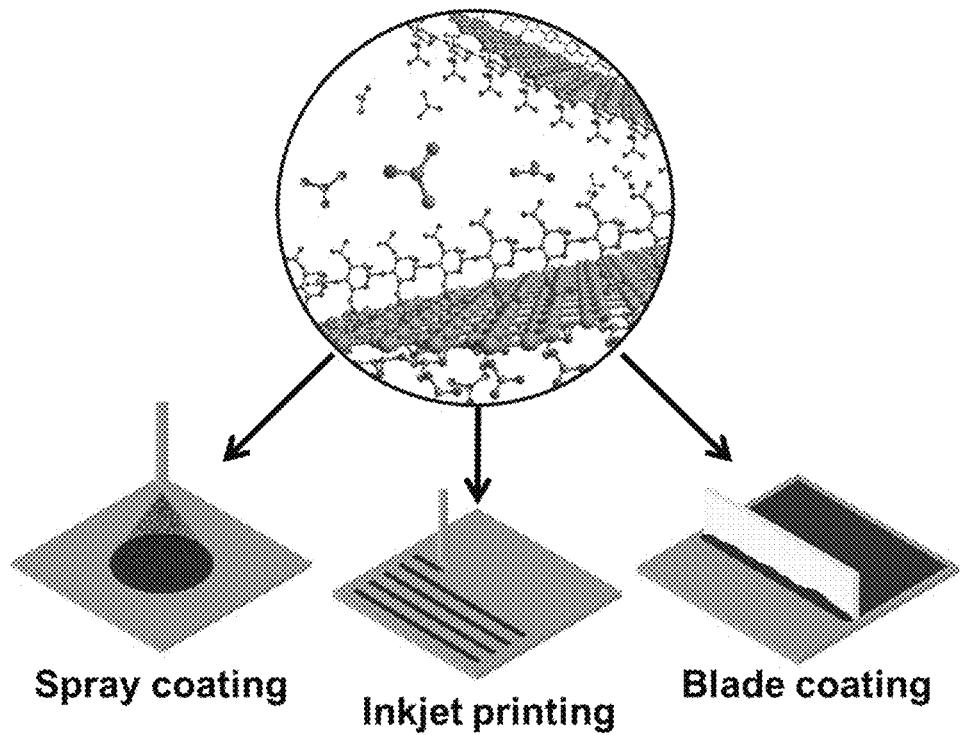
FIGS. 1A-C. Process schematic and exfoliation of graphene/nitrocellulose. (A) Schematic illustration of nitrocellulose-stabilized graphene dispersion for spray coating, inkjet printing, and blade coating. (B) AFM topography image showing individual exfoliated few-layer graphene flakes. (C) Tunable rheology of graphene/nitrocellulose inks suitable for blade coating, inkjet printing, and spray coating.
Figure 1B:
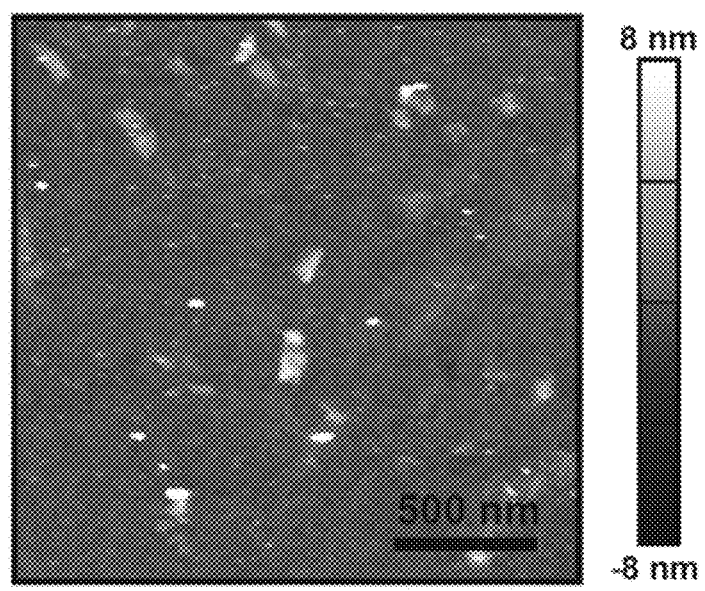

As relates to certain embodiments thereof, the present invention provides a versatile processing platform using a nitrocellulose polymer to enable the scalable integration of robust and high-performance graphene patterns in flexible printed electronics. A schematic illustration of the graphene/nitrocellulose ink is shown in FIG. 1. In certain such embodiments, processing methods to employ a nitrocellulose as a graphene dispersant/stabilizer comprise shear mixing graphite in a solution of nitrocellulose and acetone. Unexfoliated graphite flakes are removed by centrifugation, yielding a stable dispersion of few-layer graphene with a typical flake thickness of ~2 nm and lateral area of ~200× 200 nm (FIG. 1B, FIG. 2). The concentration of exfoliated graphene can reach as high as ~1 mg/mL, demonstrating the efficacy of nitrocellulose in stabilizing the graphene dispersion (FIG. 2). Salt water is then added to the graphene dispersion to induce flocculation of the graphene/nitrocellulose composite, which is subsequently isolated by centrifugation. This solid is washed and dried to yield a solid fine black powder of graphene and nitrocellulose which can be isolated from the exfoliating and aqueous media. Producing a powder intermediate simplifies the ink formulation process because the powder can be directly dispersed in a suitable solvent system. Various other processes and procedures to prepare solid graphene/nitrocellulose compositions for use in the preparation of corresponding graphene/nitrocellulose inks are, as would be understood by those skilled in the art, analogous to those described in co-pending application Ser. No. 14/121,097 filed Jul. 30, 2014, the entirety of which is incorporated herein by reference.

Figure 1C:
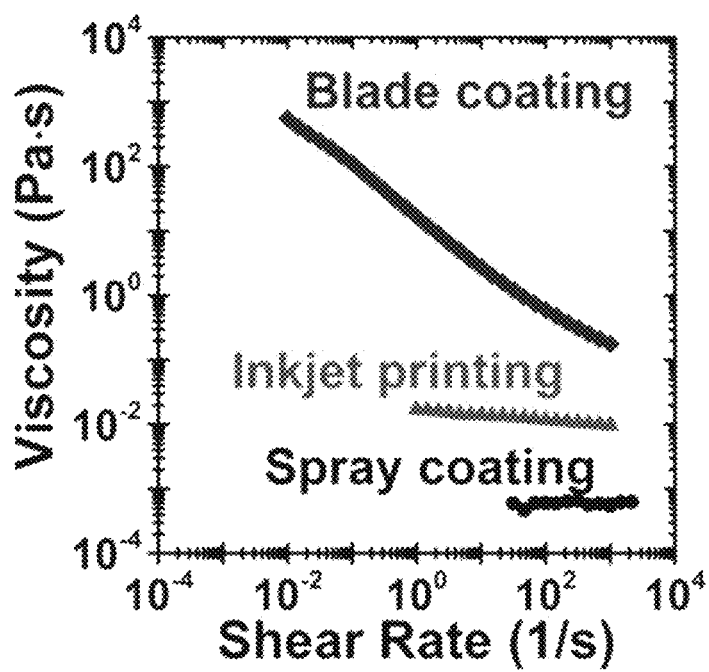
Figure 3:
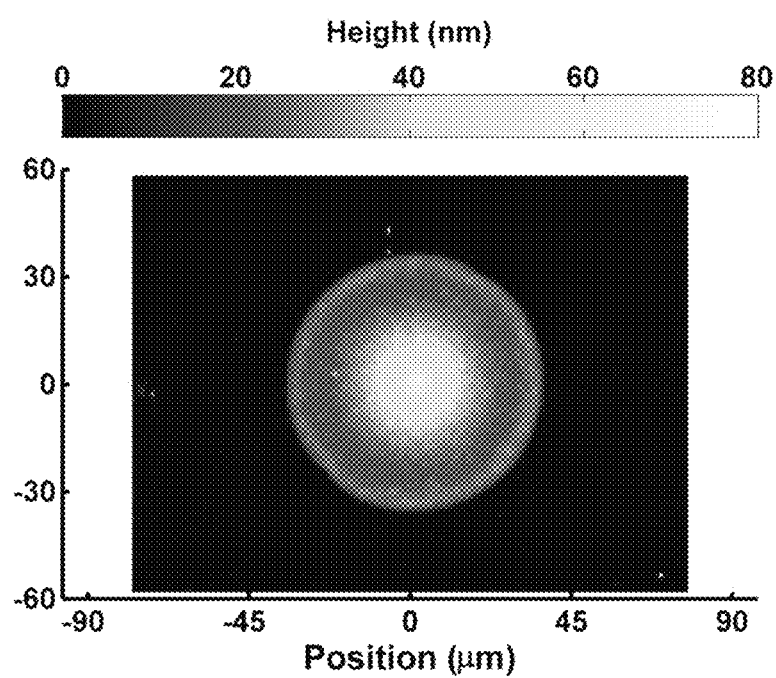
FIG. 3. Height profile of an inkjet printed drop (from FIG. 2C).

An approach of this sort in turn allows for precise control of ink properties such as concentration, viscosity, surface tension, and drying kinetics to suit a range of deposition methods. Importantly, the viscosity of graphene/nitrocellulose inks can be tuned over at least 4 orders of magnitude from a common graphene/nitrocellulose precursor. Specifically, the present invention demonstrates fluid inks and thick pastes for spray coating and blade coating, respectively, which are well-suited for the preparation of large-area, uniform films (FIG. 1C, FIG. 3). Moreover, this wide range of attainable viscosities spans values typically targeted for industrial printing methods such as stencil, screen, gravure, flexographic, aerosol-jet, and inkjet printing.

Figure 4A:
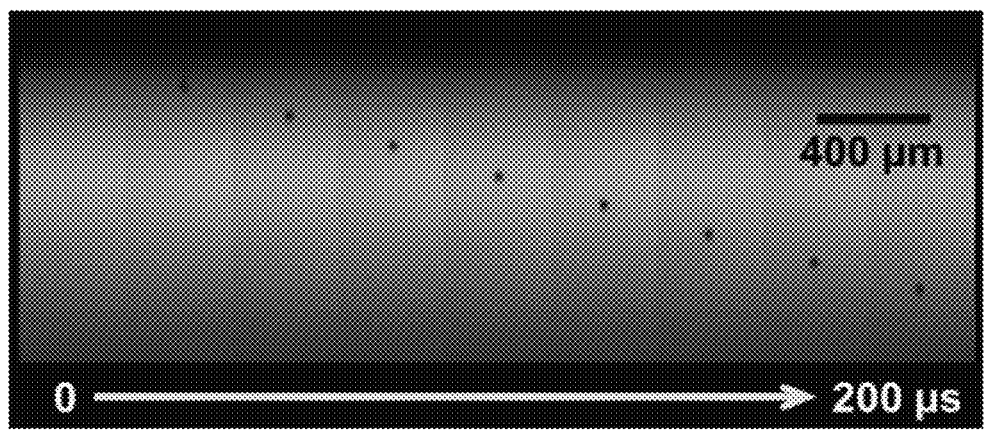
FIGS. 4A-D. Inkjet printing of graphene/nitrocellulose. (A) Images of drop formation during jetting. (B,C) Optical microscopy images of an inkjet-printed drop and large-area drop array, respectively; inset of (C) shows a height profile of a single drop. (D) Optical microscopy image of printed graphene lines, with the corresponding height profile.
Figure 4B:
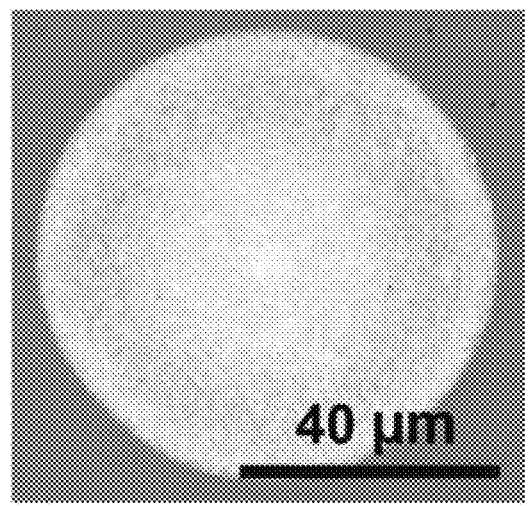
Figure 4C:
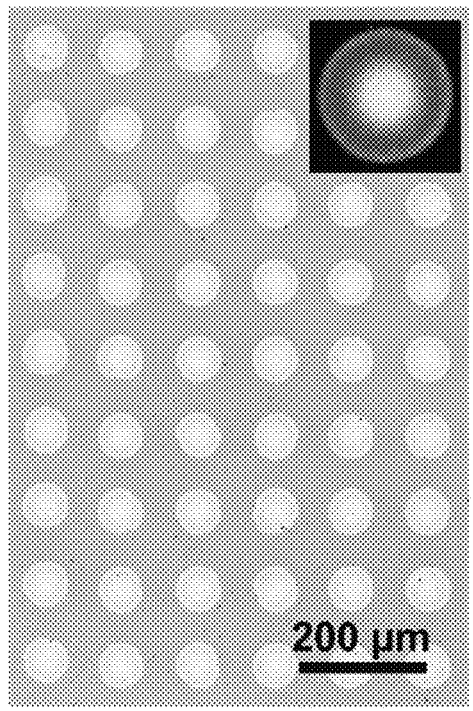
Figure 4D:
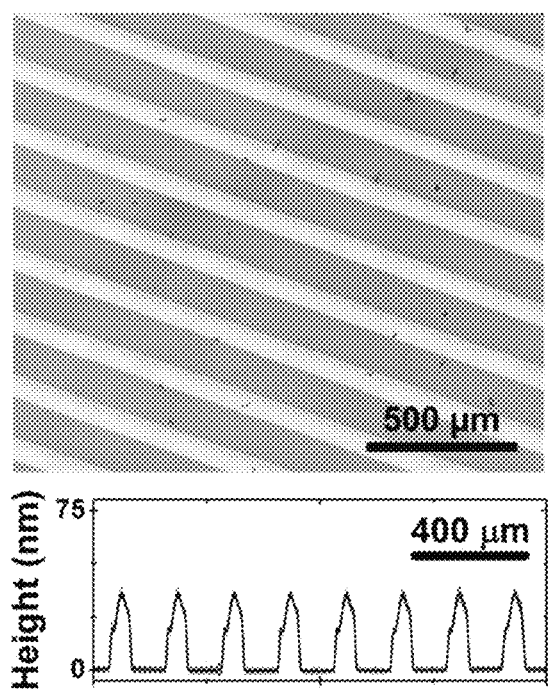

For prototyping and high-resolution additive manufacturing, inkjet printing is a particularly attractive technique since it offers non-contact, digital patterning. However, drop-on-demand inkjet printing requires precisely engineered inks with well-controlled properties including viscosity, surface tension, drying kinetics, and particle size. To prepare an ink suitable for inkjet printing, graphene/nitrocellulose powder is directly dispersed at a concentration of 2.3% w/v (~10 mg/mL graphene) in a solvent system containing ethyl lactate, octyl acetate, and ethylene glycol diacetate. This ink is designed to have a shear viscosity of ~10 mPa·s, with low-volatility solvent components included to prevent particle drying at the cartridge nozzle plate and to tune ink wetting and drying properties. A piezoelectric actuator drives the formation of spherical droplets (FIG. 4A), which spread to a diameter of ~70 µm on an untreated glass substrate (FIG. 4B). The reliability of this printing process is illustrated in FIG. 4C, with uniform drop formation and drying achieved over a large area. In addition, the drying properties of the ink are designed to prevent coffee ring formation, yielding highly uniform printed features (inset, FIG. 4C, FIG. 5). As shown in FIG. 4D, droplets coalesce to form stable and consistent lines, demonstrating the suitability of graphene/nitrocellulose for high-fidelity inkjet printing of electronic components.

Nitrocellulose chemistry affects and modulates properties of a resulting graphene pattern, due to the unique nature of the decomposition products as compared to ethyl cellulose of the prior art. To investigate the physical and chemical changes to the graphene films following annealing, thermogravimetric analysis (TGA), Raman spectroscopy, X-ray photoelectron spectroscopy (XPS), and scanning electron microscopy (SEM) are employed.

Figure 6A:
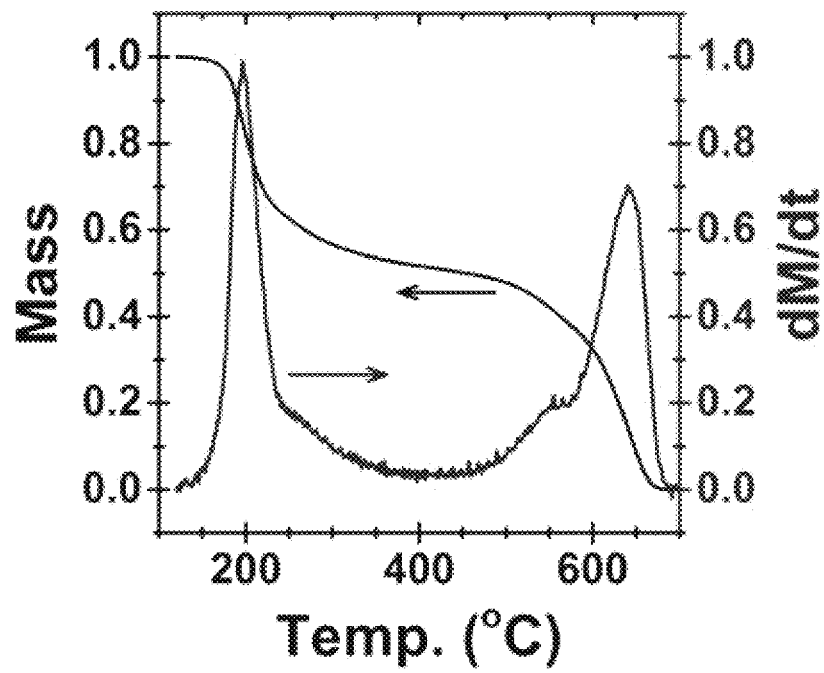
FIGS. 6A-F. Characterization of graphene/nitrocellulose thin films. (A) TGA curve for graphene/nitrocellulose powder. (B) Representative Raman spectra as-cast and following annealing. (C) XPS spectra of graphene/nitrocellulose films as-cast and following annealing. (D) XPS spectra for the C is peak at various annealing conditions. (E,F) SEM images of annealed graphene thin films, showing dense structure of overlapping flakes.

As shown by TGA in FIG. 6A, nitrocellulose exhibits a primary decomposition peak at ~200° C., resulting in ~50% mass loss of the composite material. This characteristic has been previously exploited for low temperature annealing of metallic nanomaterials, such as silver nanoparticles and copper nanowires. (Corresponding decomposition characteristics for pure nitrocellulose can be found in FIG. 7 for comparison.) The TGA results for nitrocellulose can be contrasted with those for inks based on ethyl cellulose, the latter of which require higher temperature annealing for decomposition and thus presents process compatibility challenges for thermally sensitive materials. TGA results also indicate that nitrocellulose residues remain within the film following annealing to 200-350° C. Consequently, additional characterization techniques, namely Raman spectroscopy and XPS, are useful to further investigate the nature of this residue.

Figure 6B:
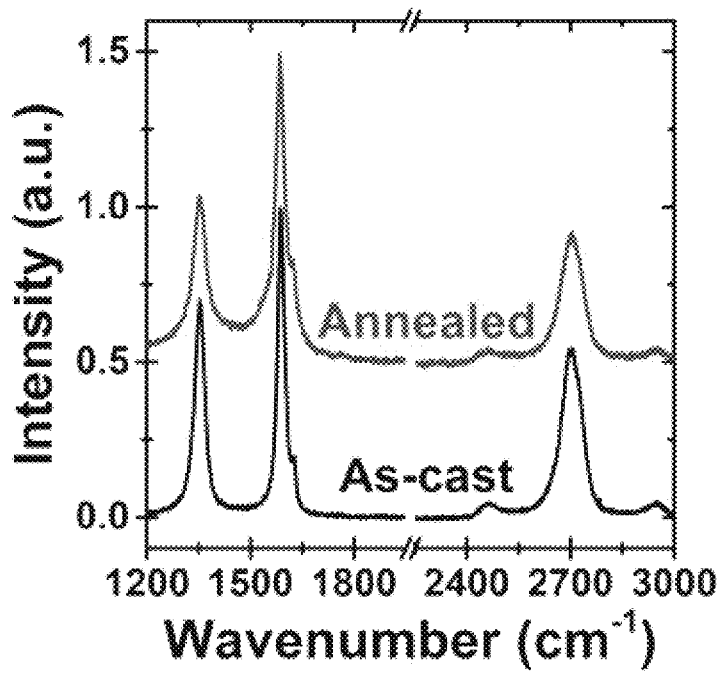

Raman spectroscopy allows the evolution of the film chemistry to be probed as a function of annealing. Raman spectra for graphene/nitrocellulose films as-cast and following annealing (350° C.) are presented in FIG. 6B. Two Raman features emerge for the film following annealing, which provide insight into its chemical composition. In particular, a broad baseline centered at ~1360 $cm^{-1}$ and a peak centered at ~1532 $cm^{-1}$ suggest the presence of amorphous carbon, which is the likely decomposition residue from nitrocellulose. Annealing is also accompanied by a reduction in the D-to-G ratio, from 0.69 to 0.48, consistent with a reduction in defect density and/or $sp^3$ bonding character, similar to graphene processed with ethyl cellulose.

Figure 6C:
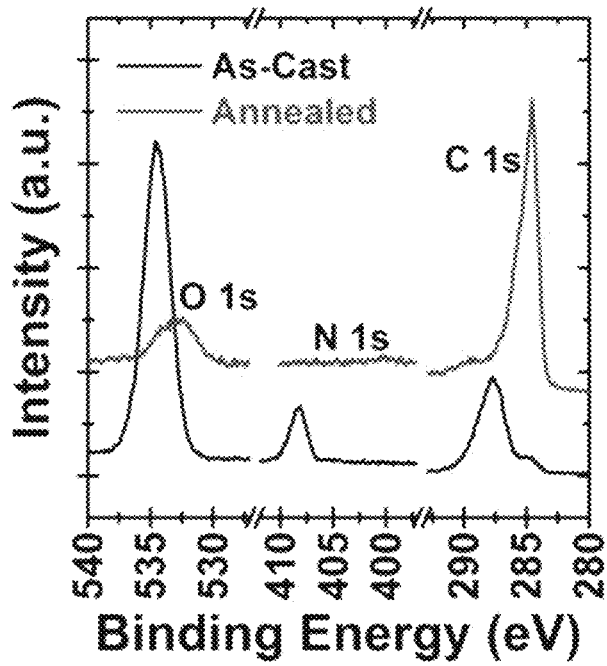
Figure 6D:
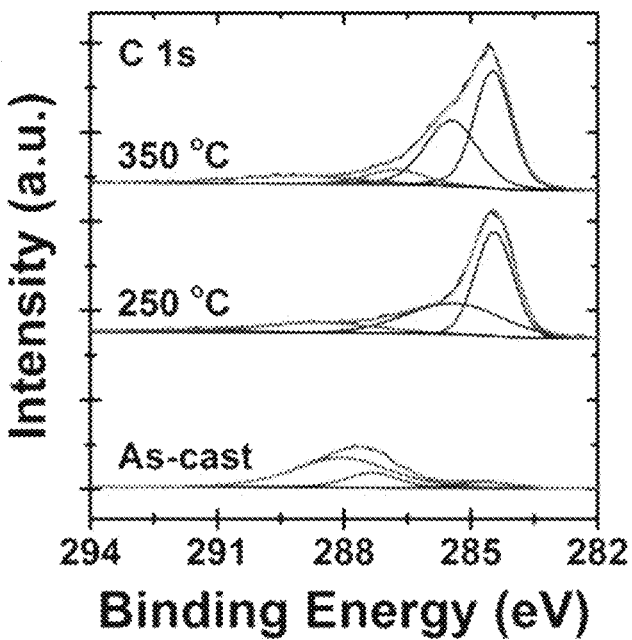

XPS provides further insight into the chemical evolution of the graphene/nitrocellulose films as a function of annealing. As shown in FIGS. 6C-D, the as-cast graphene film exhibits XPS features consistent with nitrocellulose including high O and N content, in which the N peak at 408 eV indicates the presence of nitro groups. Similarly, the C portion of the spectrum is consistent with primarily nitrocellulose, including evidence for significant ether linkages. Following annealing, the elemental composition changes substantially. Specifically, the O peak intensity is reduced, while only a minor N peak at 399 eV is observed, indicative of decomposition of the nitro groups with a small amount of N residue remaining. Moreover, the C spectrum undergoes a significant shift, with increasing $sp^2$ C content and decreasing C—O/C=O character. There remains a clear peak associated with $sp^3$ C—C/C—O centered at 285.5 eV, even following annealing at 350° C., indicative of persistent effects from the nitrocellulose that can affect film properties. This observation is consistent with the TGA results and Raman spectra, which suggest the presence of amorphous carbon residue.

Figure 6E:
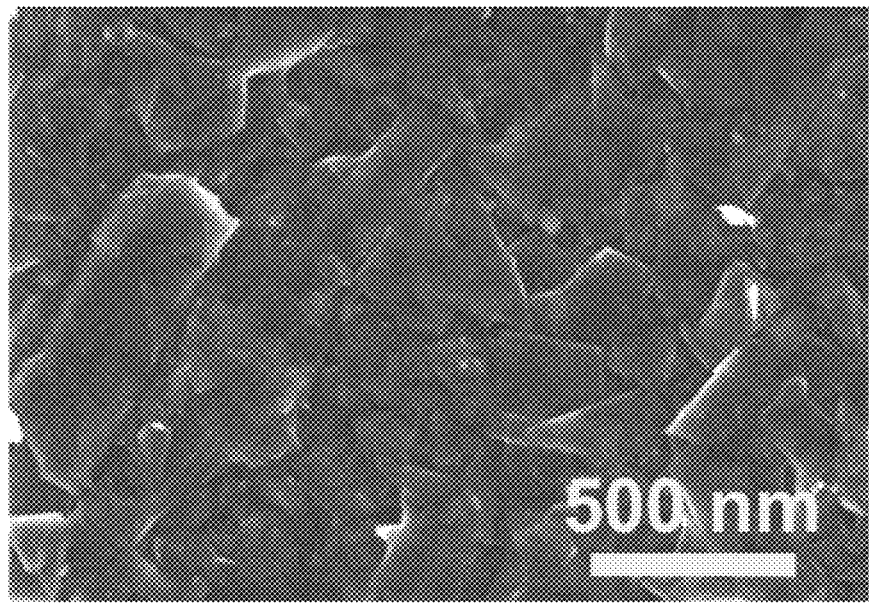
Figure 6F:
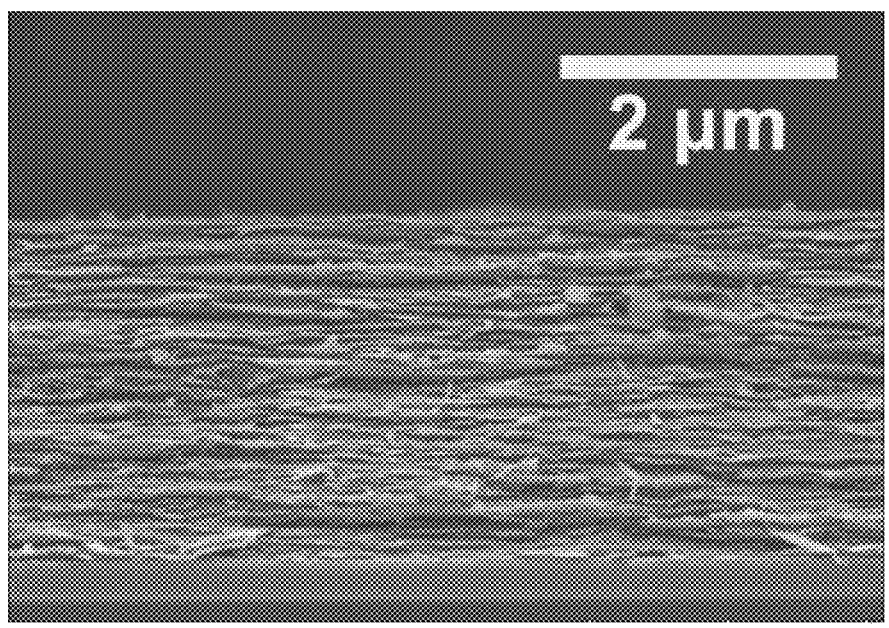

In addition to chemical composition, the film morphology plays an important role in determining functional properties such as electrical conductivity and mechanical stability. As shown in FIGS. 6E-F, graphene films exhibit a dense microstructure. In particular, the cross-sectional SEM image of FIG. 6F shows a high degree of flake alignment in the plane of the substrate, which is an important feature for improving flake-flake overlap and thus charge transport.

Figure 8A:
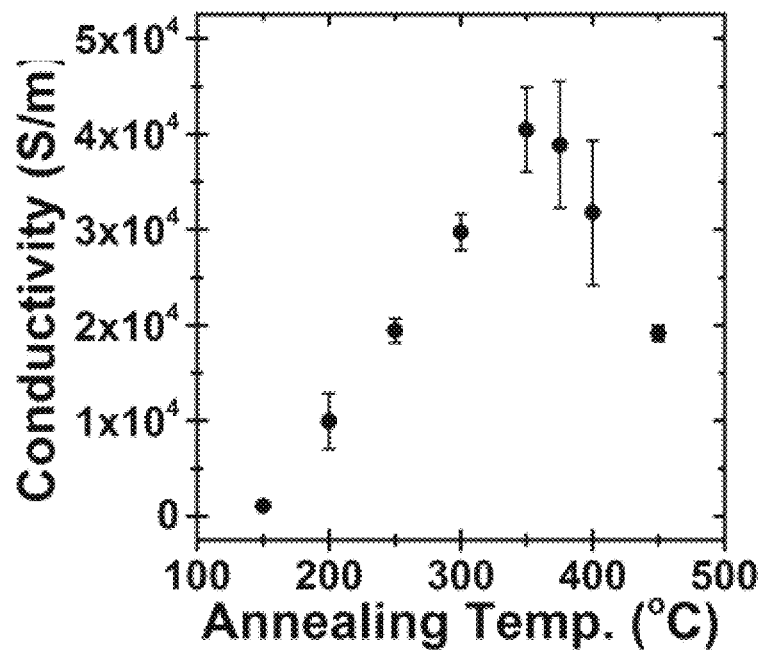
FIGS. 8A-E. Functional properties of graphene/nitrocellulose thin films. (A) Conductivity of graphene films for different annealing temperatures. (B) Normalized resistance of graphene lines over 2,000 bending cycles to a radius of curvature of 1.3 mm (tensile strain of 5.1%). (C) Optical results of the tape test for graphene/ethyl cellulose and graphene/nitrocellulose, showing digital images of graphene films during and following the test. The highlighted region (dashed lines) indicates the same location on the tape in both images. (D) Electrical results of the tape test, showing relative resistance change for graphene films on polyimide and glass. (E) Relative resistance change of graphene films following 312 hours at 85° C./85% relative humidity on polyimide and glass.

Many applications of printed and flexible electronics require conductive elements with high electrical performance and robust stability to both environmental and mechanical stresses. Graphene processed with nitrocellulose offers excellent properties in this regard. As discussed above, thermal annealing alters the composition of the graphene film, consistent with nitrocellulose decomposition with residual amorphous carbon. As a result, the electrical conductivity depends strongly on the thermal annealing conditions (FIG. 8A). The nitrocellulose polymer is largely removed following annealing at 200° C., leading to graphene films with an electrical conductivity of ~10,000 S/m. As the annealing temperature is increased, the graphene films exhibit a steadily increasing conductivity up to a peak value of 40,500±4,400 S/m, exceeding the electrical performance of alternative pristine graphene inks.

Figure 8B:
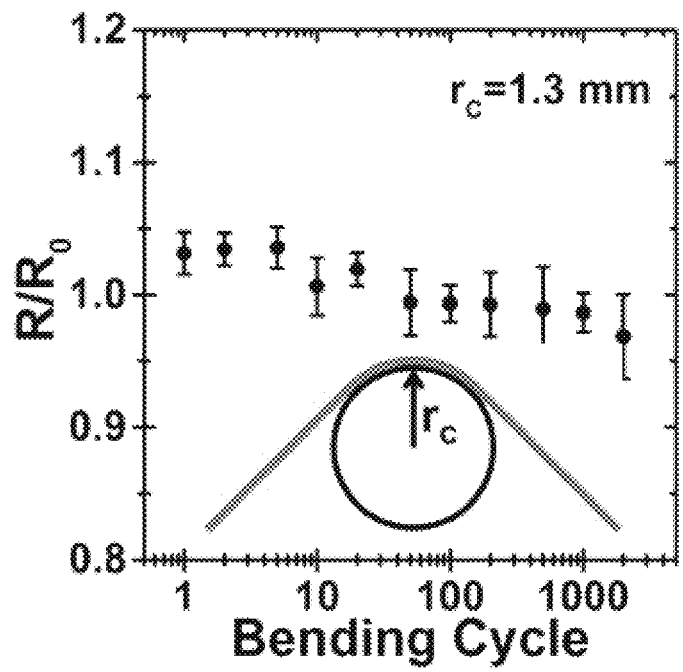

In addition to excellent electrical performance, printed graphene patterns require mechanical durability to withstand the rigors of flexible, portable consumer electronics. To test the mechanical flexibility of graphene processed with nitrocellulose, patterns were fabricated on polyimide films. The electrical resistance of the resulting graphene lines was measured over 2,000 bending cycles to a radius of curvature of 1.3 mm (tensile strain of ~4.8%) with negligible change observed (FIG. 8B), verifying the utility of this material for devices in which a high tolerance to flexing is necessary.

Figure 8C:
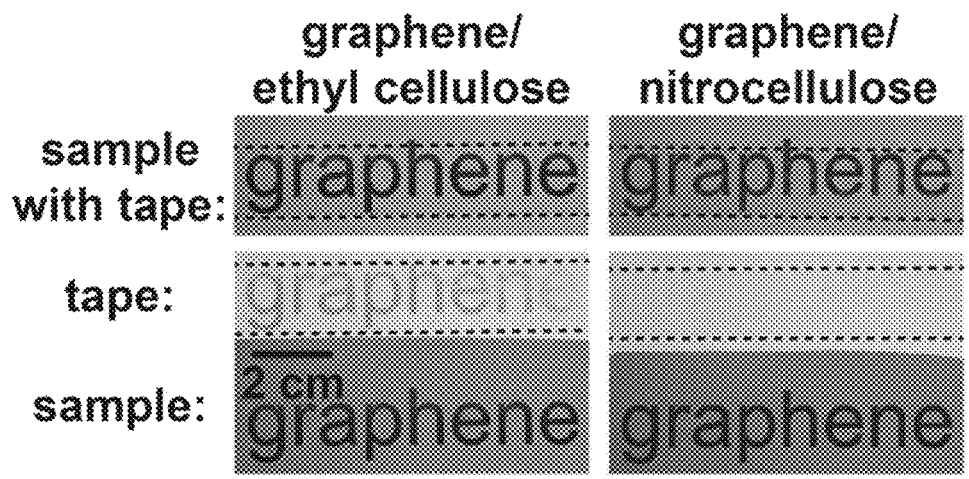
Figure 8D:
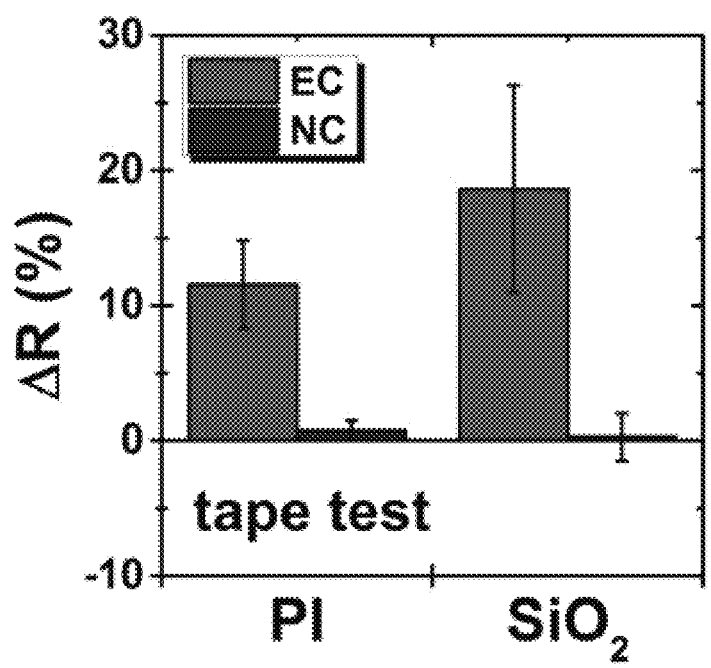
Figure 9:
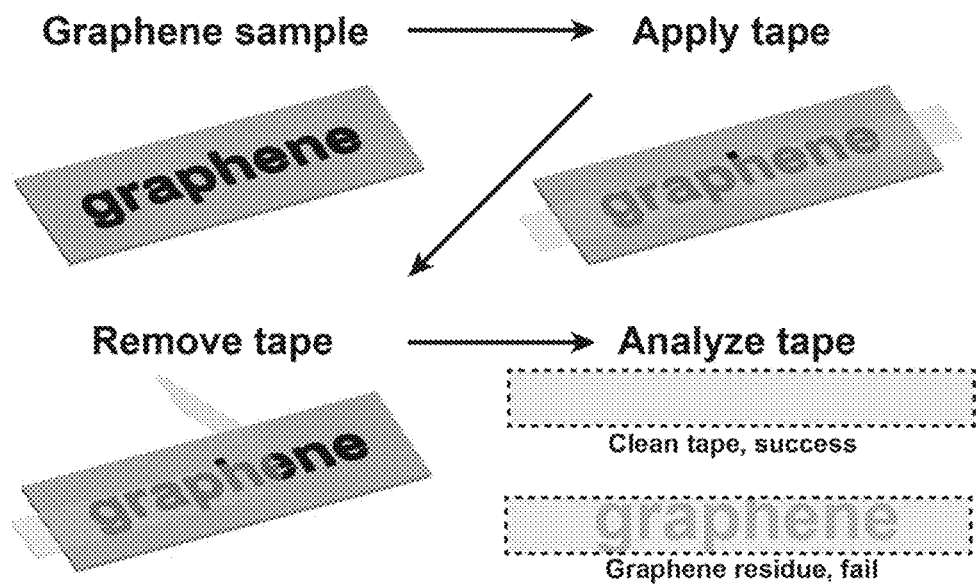
FIG. 9. Schematic description of the Scotch™ tape test.

While bending stability confirms that the material can deform without failure, it does not necessarily imply strong adhesion to the substrate. A Scotch™ tape test is therefore performed to assess the substrate adhesion performance of the graphene patterns. FIG. 9 shows a schematic illustration of this test where a piece of tape is applied to the graphene pattern and removed in a controlled manner, after which the tape and sample are inspected for evidence of film damage. This adhesion test was performed for the graphene/nitrocellulose films presented here, as well as graphene processed with ethyl cellulose, which represents the state-of-the-art in high-performance graphene inks. The optical results of the test are shown in FIG. 8C. While the graphene/ethyl cellulose patterns leave visible residue on the tape, this is not the case for graphene/nitrocellulose. Electrical measurements corroborate this result as shown in FIG. 8D. Specifically, the graphene/ethyl cellulose patterns exhibit an increased resistance by ~10-20% as a result of the tape test, while graphene/nitrocellulose patterns exhibit negligible change. These results suggest that the differences in the polymer residue in each case play a critical role in determining the film mechanical properties, especially since this residue mediates coupling between the constituent graphene flakes.

Figure 10A:
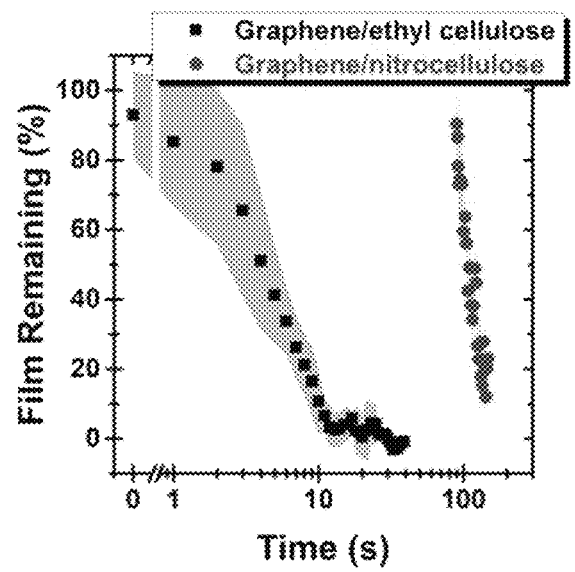
FIGS. 10A-B. Sonication test for graphene/ethyl cellulose and graphene/nitrocellulose films on glass. (A) Plot of the percent film remaining as a function of sonication time. (B) Series of images of graphene films following different durations in the ultrasonic bath.
Figure 10B:
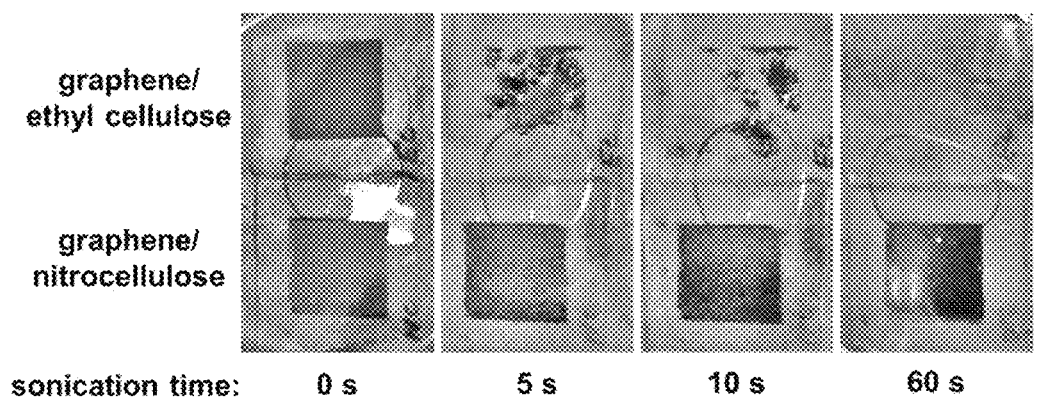

A complementary test of the adhesion and mechanical properties of the graphene films is performed using ultrasonication in water. In this experiment, graphene/ethyl cellulose and graphene/nitrocellulose films on glass are immersed in water in an ultrasonic bath. As shown in FIG. 10, the graphene/ethyl cellulose film delaminates and disintegrates within ~10 s under the harsh conditions of the ultrasonic bath. The graphene/nitrocellulose film, on the other hand, shows excellent resilience for over 1 min, with negligible film delamination or breakage. Similar graphene/nitrocellulose films on polyimide exhibit no failure for up to 10 min in the ultrasonic bath, suggesting that this difference is based on adhesion at the film-substrate interface, and the ability of water to penetrate between the film and substrate.

Figure 8E:
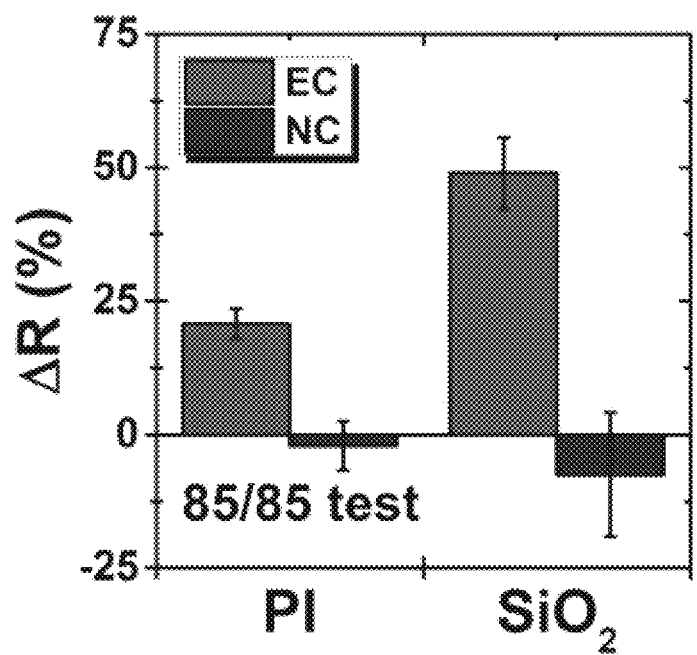

The stark difference in properties upon ultrasonication in water suggests that the nitrocellulose-based graphene patterns may also exhibit resistance to water exposure under less extreme conditions, such as high humidity. Resistance to humidity degradation carries significant implications for a diverse range of practical applications for which printed electronics components and devices must operate reliably in demanding environmental conditions. A damp heat test was conducted to assess the performance of graphene patterns exposed to 85° C. and 85% relative humidity for 312 hours. As shown in FIG. 8E, graphene processed with nitrocellulose shows no systematic change in electrical performance following this high temperature and high humidity exposure. In contrast, the resistance of graphene/ethyl cellulose patterns increases by 21% and 49% on polyimide and glass substrates, respectively. This result is also important for applications in harsh environments, in which graphene already presents an advantage over more reactive or unstable conductors, such as thermally sensitive conducting polymers and corrosion-susceptible metals.

As relates to certain embodiments of this invention, annealing to decompose the dispersant can, in certain situations, present process integration limitations. In particular, traditional thermal processing can limit process speed and compatibility with temperature-sensitive materials. As a result, the present invention can comprise photonic annealing (i.e., intense pulsed light annealing). Such a process can employ a broadband pulsed light source, typically a xenon arc lamp, to produce high-intensity (~1-5 kW/cm$^2$) light pulses with durations on the order of milliseconds. Preferential optical absorption within the active film leads to rapid local heating that limits thermal damage to passive components such as the underlying substrate. While prior results on photonic annealing of printable graphene inks have been promising, optimal utilization of this technique requires complementary ink properties tailored to the annealing method. Toward that end, the present invention provides a graphene ink comprising nitrocellulose designed for pulsed light annealing and which exhibits rapid and exothermic decomposition. This approach enables highly conductive and porous graphene patterns with broad process compatibility and superlative performance metrics in addition to establishing a compelling ink design strategy for broader application in photonic annealing.

Figure 13A:
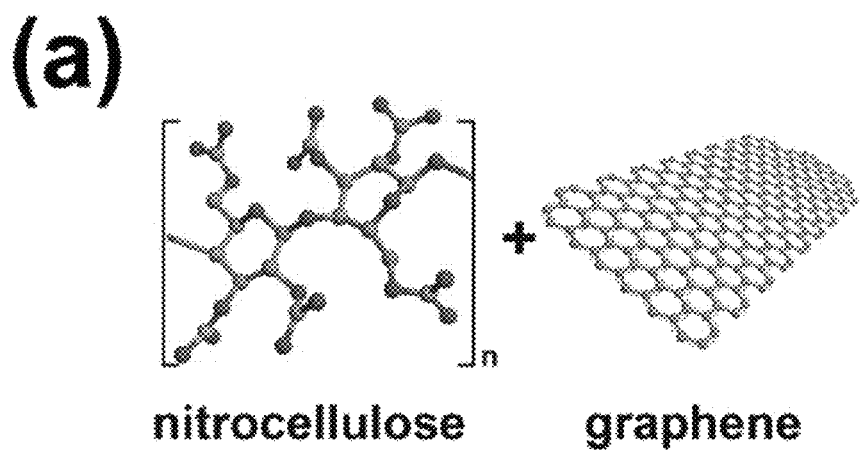
FIGS. 13A-C. Process overview and proof of concept. (A) Chemical structure of nitrocellulose (left) and graphene (right). (B) Differential scanning calorimetry of graphene/nitrocellulose showing the large exothermic reaction of nitrocellulose at ~200° C. (C) Schematic illustration of photonic annealing, which initiates a nitrocellulose propagating reaction. Cross-sectional scanning electron microscopy reveals the resulting porous graphene microstructure even on a thermally conductive silicon substrate.

As discussed above, nitrocellulose (NC) effectively disperses graphene, providing stable inks with graphene concentrations up to about 10% w/v or more. In addition, the oxidizing nitrate groups of NC afford high chemical reactivity that favors exothermic decomposition with rapid kinetics consistent with photonic annealing (FIG. 13A). Due to its rapid and exothermic decomposition, NC acts as an intrinsic energy source to fuel a propagating reaction, with positive implications for process generality. Moreover, the evolution of volatile gaseous species upon NC decomposition leads to a highly porous microstructure, offering advantages for applications such as energy storage, catalysis, and sensing.

Figure 13B:
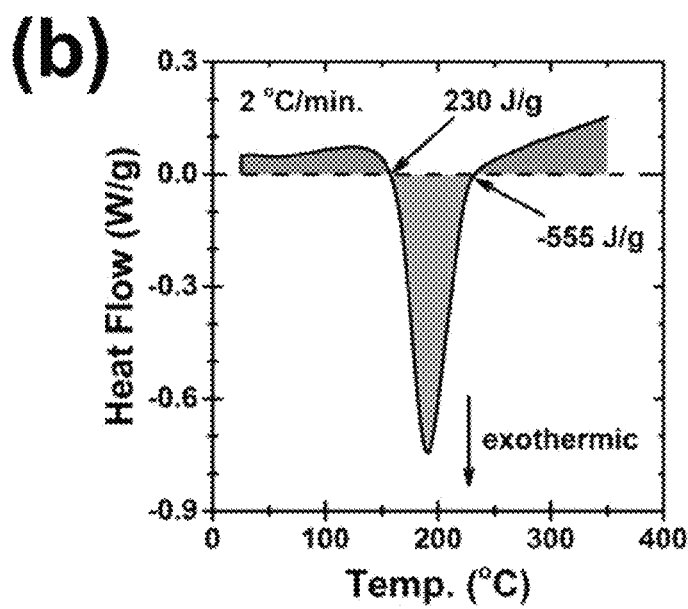
Figure 13C:
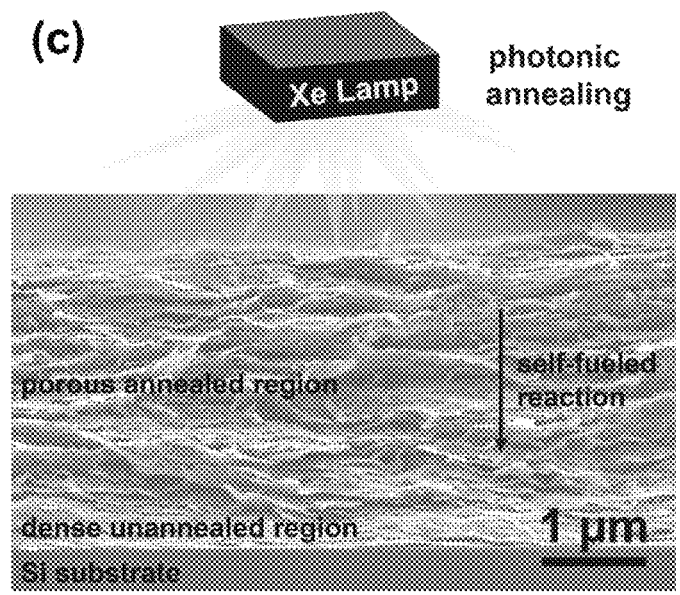
Figure 14:
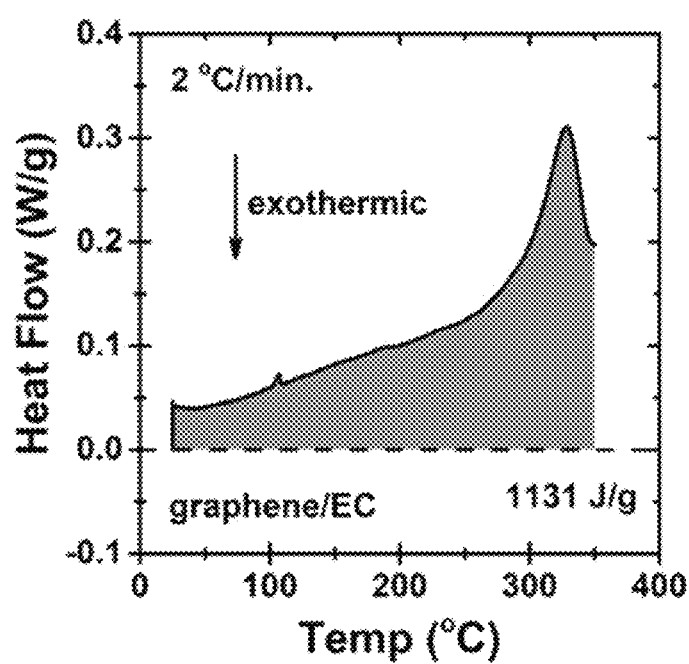
FIG. 14. Differential scanning calorimetry of graphene/EC showing endothermic decomposition for EC. The measurement is taken under nitrogen to more closely mimic rapid photonic annealing.

As illustrated herein, composite graphene/NC powder can be produced by high shear mixing, centrifugation, and flocculation steps (without limitation, reference is made to Examples 7-15 and FIGS. 13-21 in further support of the following discussion). This procedure can yield a powder containing ~35 wt. % graphene flakes with a typical thickness of ~2 nm and lateral size of ~300 nm. For the suggested propagating reaction to occur, the energy released upon NC decomposition should be sufficiently greater than the energy required to initiate the decomposition reaction. Differential scanning calorimetry (DSC) results shown in FIG. 13B indicate that NC decomposes exothermically at ~200° C., releasing ~3× more energy than the amount required to heat the material to the decomposition temperature, which suggests that the NC combustion will likely propagate once locally initiated. In contrast, a control sample of graphene/ethyl cellulose (EC), a common prior art dispersant for graphene inks, exhibits endothermic decomposition characteristics (FIG. 14). The differences in reaction kinetics and thermodynamics between NC and EC are further demonstrated by a photonic annealing test on a silicon substrate. Importantly, photonic annealing is traditionally limited to substrates that act as poor heat sinks, such as paper and plastic. Substrates with higher thermal mass and thermal conductivity, such as silicon, extract heat out of the active film rapidly to quench the process, limiting its applicability. However, the high exothermicity of NC combustion enables photonic annealing on silicon, while the rapid release of volatile decomposition products leads to a porous microstructure, as shown in the cross-sectional scanning electron microscopy (SEM) image in FIG. 13C. Although the bottom portion of the film (<1 μm) appears to remain unannealed, with a dense, polymer-rich structure, the remainder of the film (top ~3 μm) shows evidence of photonic annealing. This morphology is notably not observed for comparable films of graphene/EC (FIG. 15).

Figure 16A:
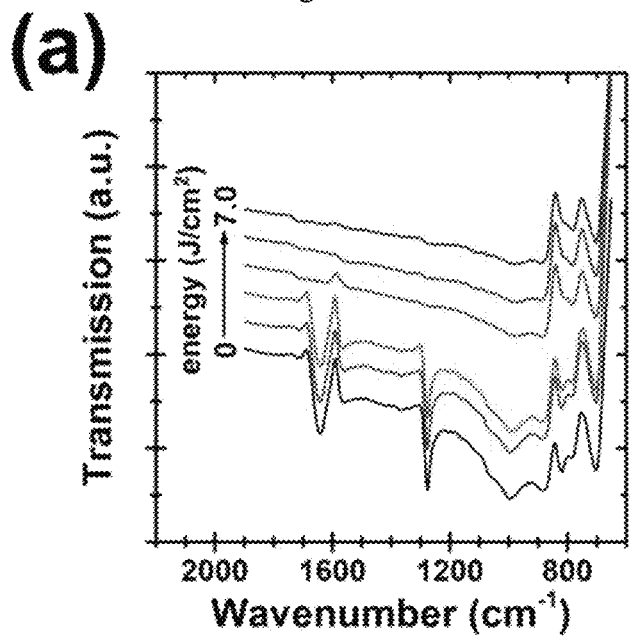
FIGS. 16A-C. Chemical characterization of photonically annealed graphene/nitrocellulose films. (A) FTIR spectra for graphene/nitrocellulose films following different photonic annealing conditions. (B) Evolution of the FTIR peak intensity with photonic pulse energy, showing a sharp threshold. (C) Elemental composition of the films as determined by XPS.
Figure 16B:
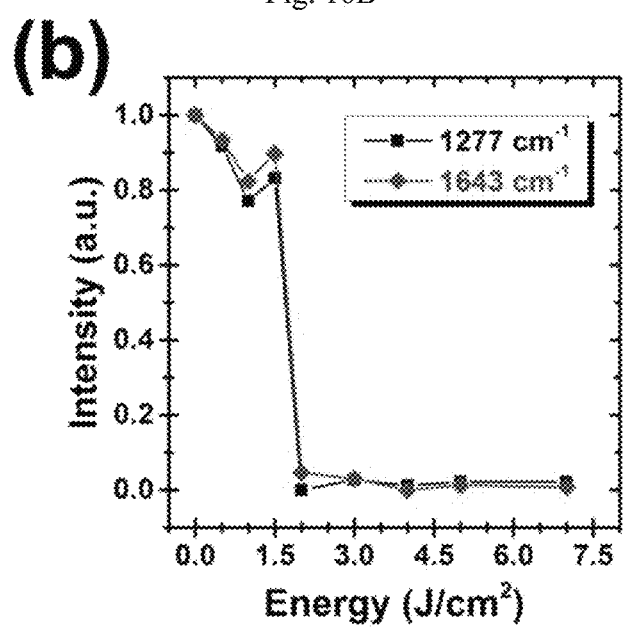
Figure 16C:
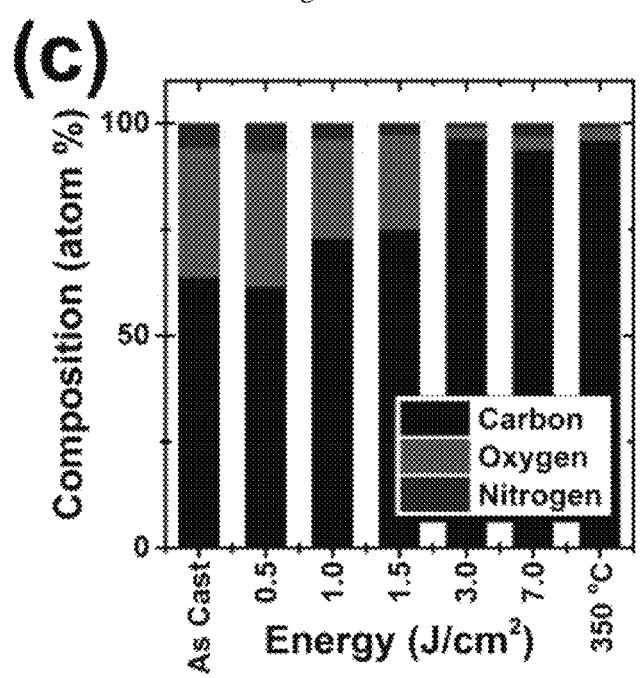

To better understand and characterize the nature of the annealing process and resulting properties, comprehensive chemical and electrical characterization was performed. For example, Fourier transform infrared (FTIR) spectroscopy, shown in FIG. 16A, indicates the presence of nitrate peaks from the NC at 1277 cm$^{-1}$ and 1643 cm$^{-1}$ preceding photonic annealing. At low photonic annealing energies, these peaks show little change. However, above a threshold pulse energy, the NC peaks are no longer observable, suggesting an abrupt transition between the as-cast and annealed states (FIG. 16B). These results are consistent with a self-fueled reaction, which leads to complete annealing of the graphene/NC film following initiation.

Similar characteristics are also observed with X-ray photoelectron spectroscopy (XPS, FIGS. 16C, 17A), which is used to track elemental composition. At low pulse energies, the films show similar composition to the as-cast film, with an abrupt transition to fully annealed films after a threshold pulse energy is exceeded. In addition, Raman spectroscopy (FIGS. 17B-C) shows the prominent D and G peaks of graphene, with a slight reduction in the $I_D/I_G$ ratio from 0.58 to 0.50 upon annealing, which is consistent with a decrease in sp$^3$ bonding character in the film. Altogether, this chemical characterization suggests a sharp threshold for annealing after which the propagating, self-sustaining nature of the reaction leads to nearly complete decomposition with minimal evidence of residual NC.

Figure 18A:
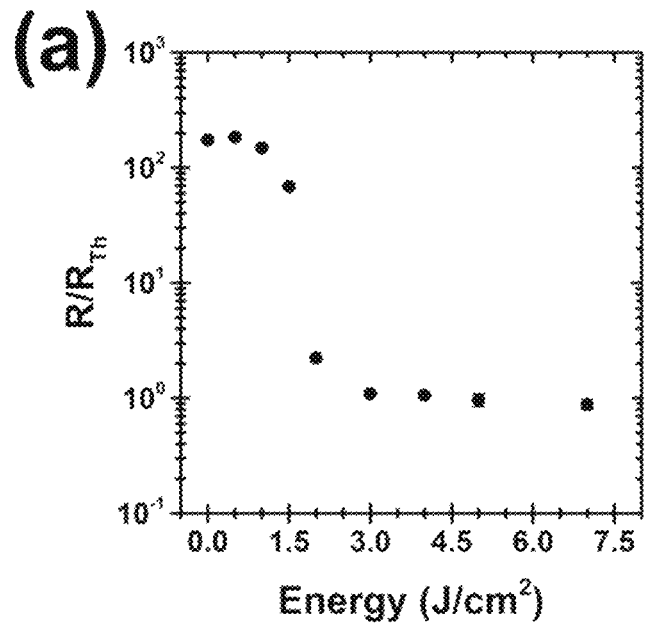
FIGS. 18A-C. Electrical characterization of photonically annealed graphene/nitrocellulose films. (A) Sheet resistance as a function of photonic annealing pulse energy. (B) Normalized sheet resistance relative to thermal annealing for graphene/nitrocellulose films on various substrates. (C) Sheet resistance for graphene/nitrocellulose films as a function of thickness following thermal and photonic annealing. The reported thickness corresponds to the thickness prior to annealing (photonic annealing leads to thicker films with the same amount of material due to the resulting porous microstructure).
Figure 18B:
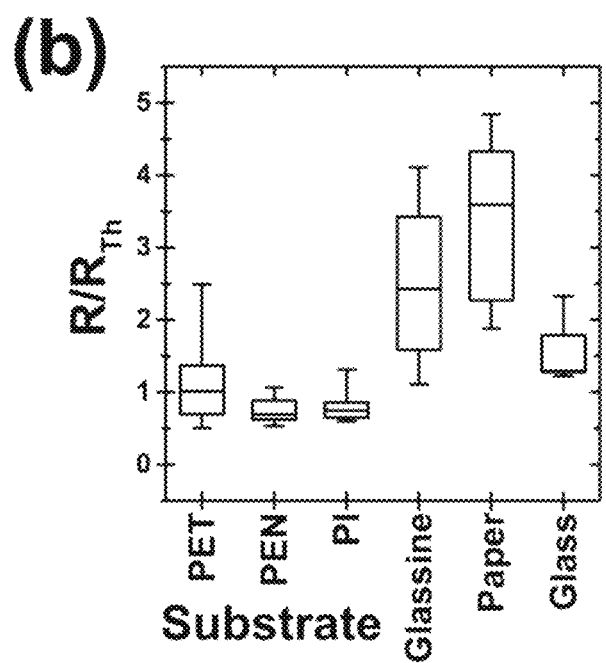
Figure 18C:
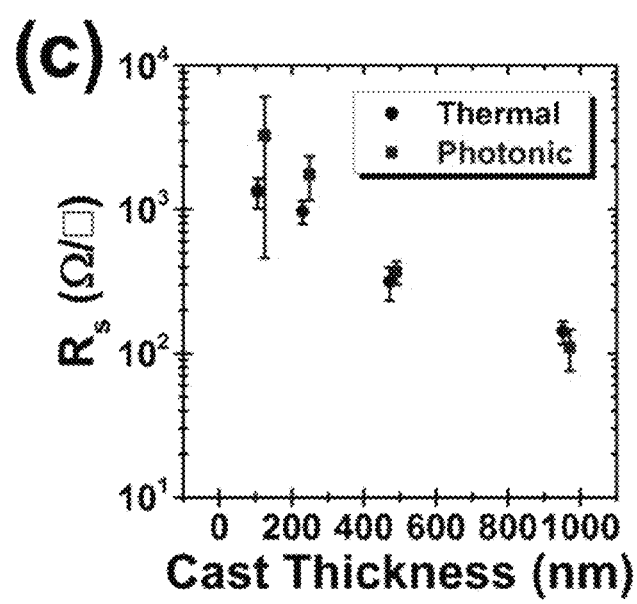
Figure 19:
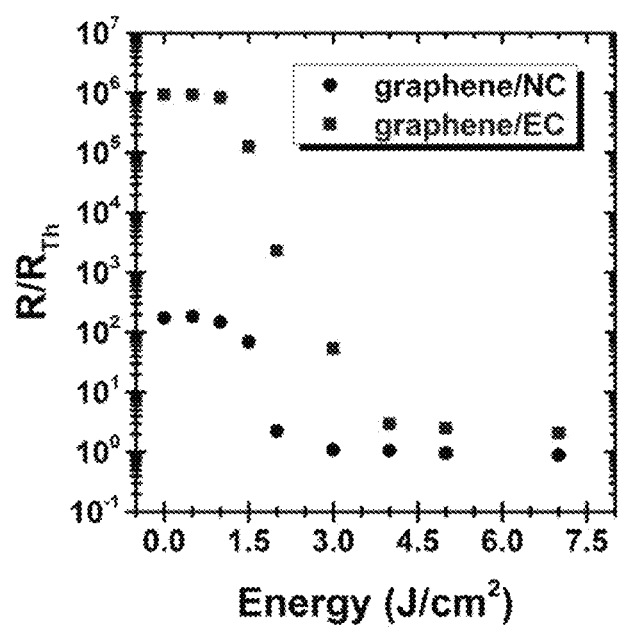
FIG. 19. Sheet resistance of photonic annealed samples relative to a thermally annealed reference for graphene/NC and graphene/EC. Graphene/NC shows an abrupt threshold for nitrocellulose decomposition and a minimum resistance on par with thermal annealing.

Electrical characterization of the graphene films is provided in FIG. 18. As the annealing energy is increased, a sharp drop in sheet resistance is observed (FIG. 18A) in a manner consistent with the preceding chemical characterization. In contrast, polymer binders with endothermic decomposition can be partially annealed by low energy pulses, which manifests itself as a gradual decrease in sheet resistance as a function of annealing energy (FIG. 19). Despite its increased porosity, the graphene/NC films maintain a low sheet resistance similar to that of thermally annealed films, thus presenting a desirable combination of high surface area and efficient charge transport. Furthermore, photonic annealing with NC allows the formation of conductive graphene films on a variety of substrates as shown in FIG. 18B. These results show that photonic annealing is effective for graphene/NC films on PET and PEN, substrates incompatible with temperatures greater than 200° C., along with low-cost, paper-based substrates such as glassine and standard office paper. The somewhat higher (~2-4×) sheet resistance measured on these paper-based substrates is likely a result of the increased surface roughness relative to the thermally annealed control on low-roughness glass. Nevertheless, the realization of conductive graphene films on paper-based substrates offers compelling prospects for printed electronics since the low-cost, sustainable production, and recyclability of paper make it an attractive substrate for large-volume, disposable devices.

Photonic annealing of graphene/NC generalizes effectively across a range of film thicknesses. FIG. 18C shows that the sheet resistances of thermally and photonically annealed films agree well as a function of thickness up to micron-thick films (FIG. 18C). Photonic annealing of micron-thick graphene films without NC is often less effective than thermal annealing, because energy applied by photonic annealing is absorbed primarily near the surface and dissipates through the film. The resulting thermal gradients lead to uneven annealing of the sample, requiring multiple annealing cycles and introducing potentially damaging mechanical stresses. The high energy content and uniform distribution of NC, on the other hand, enable complete annealing with a single light pulse.

Photonic annealing has attracted considerable interest for additive manufacturing beyond the scope of printed electronics. However, the effectiveness of this technique has historically been strongly dependent on the thermal properties of the substrate. While the field of printed electronics is largely concerned with applications on thin, thermally-insulating substrates (e.g., plastic and paper), many other additive manufacturing applications involve substrates that act as effective heat sinks, including materials with high thermal conductivity and thermal mass. In this scenario, the rapid dissipation of heat from the functional film can severely limit the efficacy of photonic annealing, with the required power scaling with the square root of the substrate thermal conductivity. For example, photonic annealing on silicon is expected to require ~25 times more power than annealing on PET, which exceeds the limits of many photonic annealing systems. On the other hand, the exothermicity of NC overcomes this limitation, as demonstrated by successful photonic annealing on a silicon wafer (FIG. 13C). To further explore this feature of graphene/NC, Raman spectroscopy was used to evaluate the effectiveness of photonic annealing on substrates ranging from paper to copper foil. In all cases, a reduction in the $I_D/I_G$ ratio following photonic annealing is observed (FIG. 17C), indicative of effective photonic annealing even on substrates with high thermal conductivity, such as aluminum foil.

The combination of high surface area and efficient charge transport for photonically annealed graphene/NC films is desirable for many applications including energy storage, catalysis, and sensing. In particular, microsupercapacitors (MSCs) are an emerging energy storage platform for printed electronics. These devices store charge at the interface of electrodes and a liquid or gel electrolyte, offering high power density, excellent cycling lifetime, and straightforward fabrication. The planar architecture of MSCs also facilitates integration of energy storage and other circuit components on a single substrate, providing benefits for portable, wearable electronics with on-chip power management. To illustrate the utility of graphene/NC for MSCs, a graphene/NC ink was developed for direct ink writing (DIW), which is a digital, liquid-phase printing method that allows for low-cost, additive fabrication of complex patterns. The excellent dispersion stability, solvent compatibility, and tunable rheology of graphene/NC allows for the straightforward preparation of a DIW printable graphene/NC ink that contains 8% w/v solids in ethyl lactate. This ink is used to fabricate graphene/NC interdigitated patterns by DIW (FIG. 20A) for application as MSC electrodes.

Figure 20A:
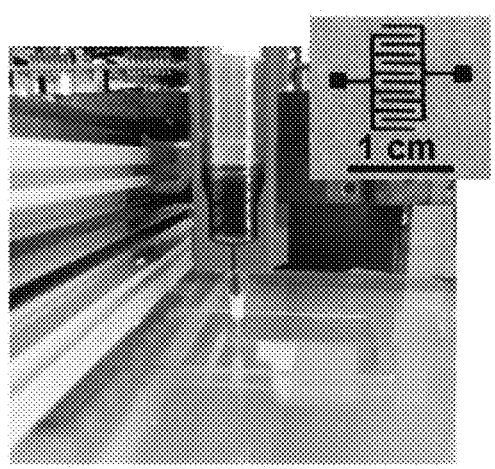
FIGS. 20A-D. Printed and photonically annealed graphene/nitrocellulose microsupercapacitors. (A) Digital image of the extrusion printing head during device fabrication, with an inset image of the printed interdigitated electrodes. (B) Optical profilometry data showing the height map of the device active area. (C) Cyclic voltammetry for microsupercapacitors following thermal and photonic annealing. (D) Microsupercapacitor capacitance as a function of current from galvanostatic charge/discharge cycling.
Figure 20B:
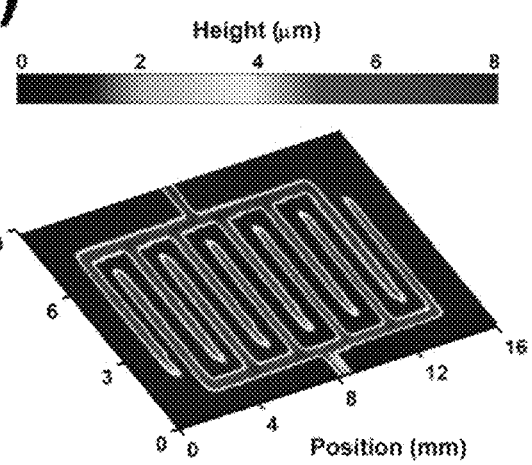
Figure 20C:
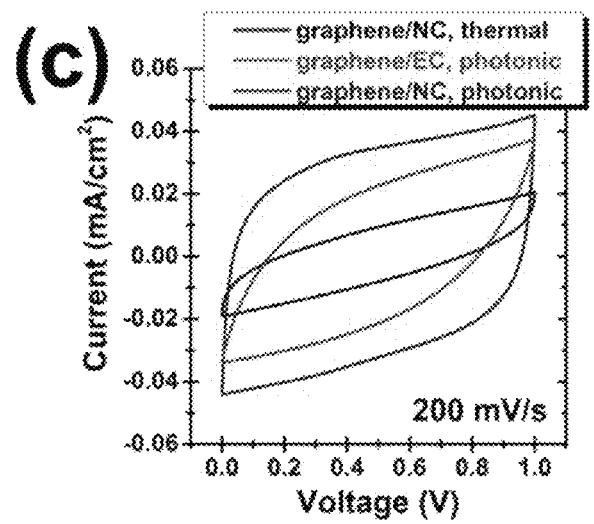
Figure 21A:
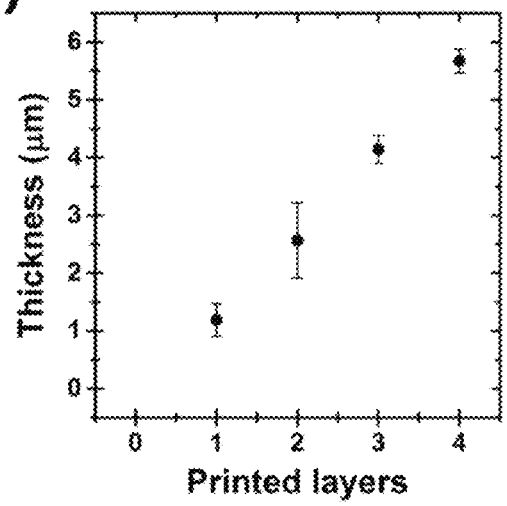
FIGS. 21A-D. Characterization of graphene MSCs. (A) Thickness and (B) capacitance of printed graphene/NC MSCs as a function of printed layer number, showing a consistent linear increase in both values. (C) Capacitance for graphene/EC MSCs with different thicknesses, showing relatively constant performance. (D) Capacitance retention of graphene/NC MSC over 1000 cycles.

Graphene/NC MSCs were DIW printed and processed by thermal or photonic annealing, along with control devices of graphene/EC for comparison. An optical profilometry height map of a representative printed graphene/NC pattern is shown in FIG. 20B. The consistent height and trace width confirms the reliability of the DIW printing process, while the thickness of the pattern can be readily controlled by varying the number of printed layers (FIG. 21A). Electrochemical measurements were performed following application of a gel electrolyte containing PVA/H$_3$PO$_4$/H$_2$O. Cyclic voltammetry (CV) curves are shown in FIG. 20C, exhibiting a rectangular shape and an increased current for photonically annealed graphene/NC devices. These MSCs show higher current than thermally annealed devices, resulting from the porous morphology and increased active surface area realized by photonic annealing. The graphene/EC devices, however, exhibit a less rectangular CV profile, due to higher series resistance resulting from the limited efficacy of photonic annealing for thick graphene/EC films.

Figure 20D:
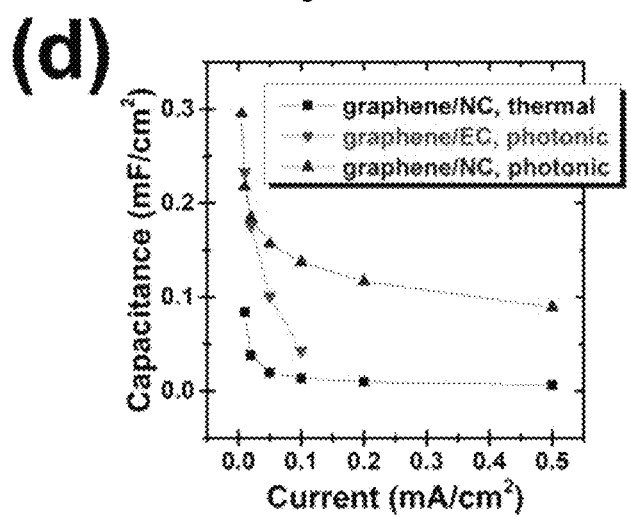

Galvanostatic charge/discharge cycling was then performed to measure the capacitance and rate capability of the photonically annealed graphene/NC MSCs (FIG. 20D).

Figure 21B:
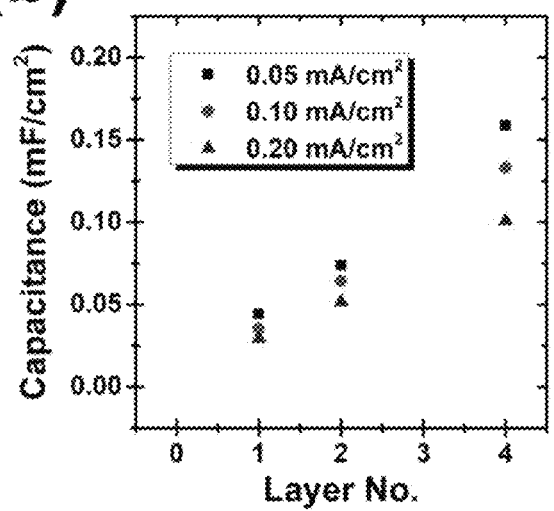
Figure 21C:
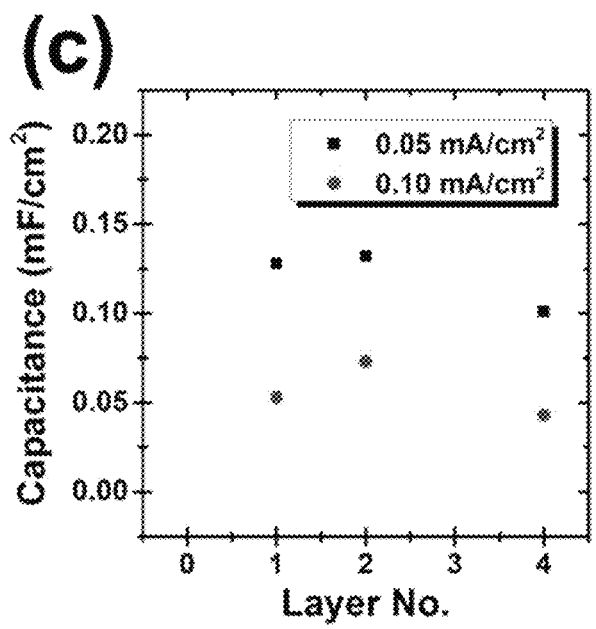
Figure 21D:
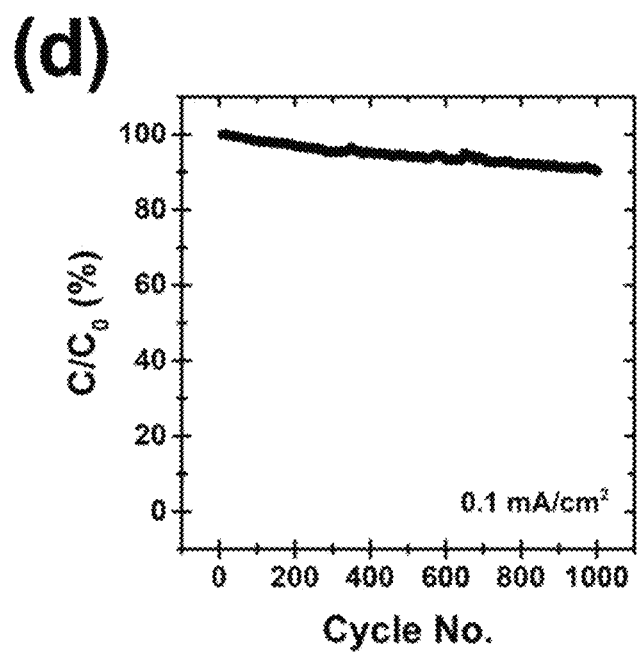

Notably, at a moderate current density of 0.1 mA/cm$^2$, the photonically annealed graphene/NC MSC on glassine exhibits a capacitance of 0.14 mF/cm$^2$, which is 10× greater than the capacitance of the thermally annealed device and an improvement of 3× relative to the graphene/EC case and similar printed, graphene-based MSCs in the literature. Moreover, the performance is found to scale linearly with device thickness, which is a characteristic not observed for graphene/EC due to the reduced efficacy of photonic annealing for thick films containing the EC binder (FIGS. 21B-C). In addition, the glassine-based photonically annealed graphene/NC MSC possesses high cycling stability, with >90% capacitance retention following 1000 cycles (FIG. 21D).

In light of the preceding, the present invention also demonstrates rapid photonic annealing of graphene/NC films, in which the exothermic NC binder acts as a built-in energy source to assist the annealing reaction. Chemical and electrical characterization reveals effective annealing with a single millisecond light pulse, resulting in properties comparable to extended thermal annealing at 350° C. Moreover, the rapid volatilization of the NC binder leads to a porous microstructure, providing enhanced surface area for applications such as energy storage, sensing, and catalysis. The favorable process compatibility of this method is leveraged in combination with the versatile liquid-phase processing platform for graphene inks, enabling direct ink writing of printed solid-state graphene microsupercapacitors on flexible substrates such as glassine paper. While particularly useful for graphene inks, the attributes of NC as a synergistic binder for photonic annealing can likely be generalized to other material systems of interest to additive manufacturing.

EXAMPLES OF THE INVENTION

The following non-limiting examples and data illustrate various aspects and features relating to the methods, compositions, composites and related devices of the present invention, including the preparation and use of graphene ink compositions, as are available through the methodologies described herein. In comparison with the prior art, the present methods, compositions, composites/devices provide results and data which are surprising, unexpected and contrary thereto. While the utility of this invention is illustrated through the use of several compositions and related composites/devices, it will be understood by those skilled in the art that comparable results are obtainable with various other methods, compositions and composites/devices as are commensurate with the scope of this invention.

Example 1

Liquid-Phase Exfoliation and Processing of Graphene.

Figure 2A:
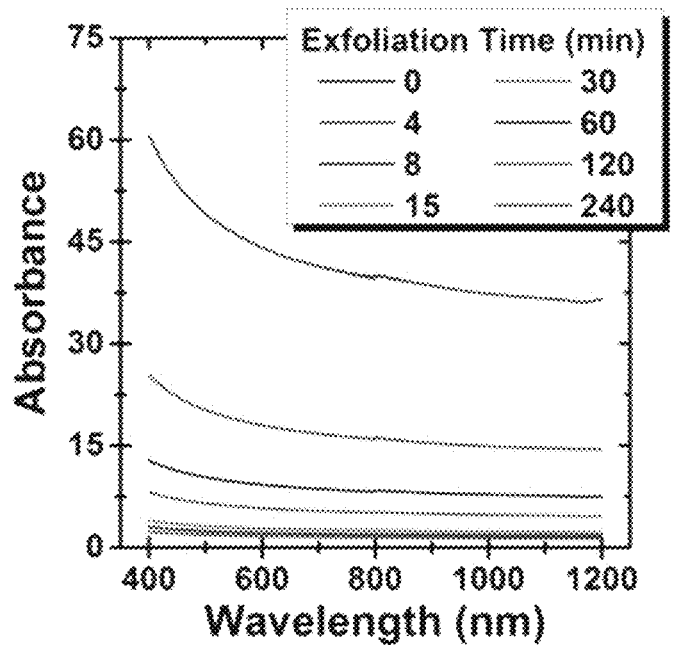
FIGS. 2A-D. (A) UV-Vis absorbance spectra of exfoliated graphene/nitrocellulose dispersions corresponding to different shear mixing times. (B) Graphene yield as a function of shear mixing time, showing preparation of high concentration dispersions. (C,D) Number-weighted and volume-weighted histograms showing flake area and thickness distribution, respectively.
Figure 2B:
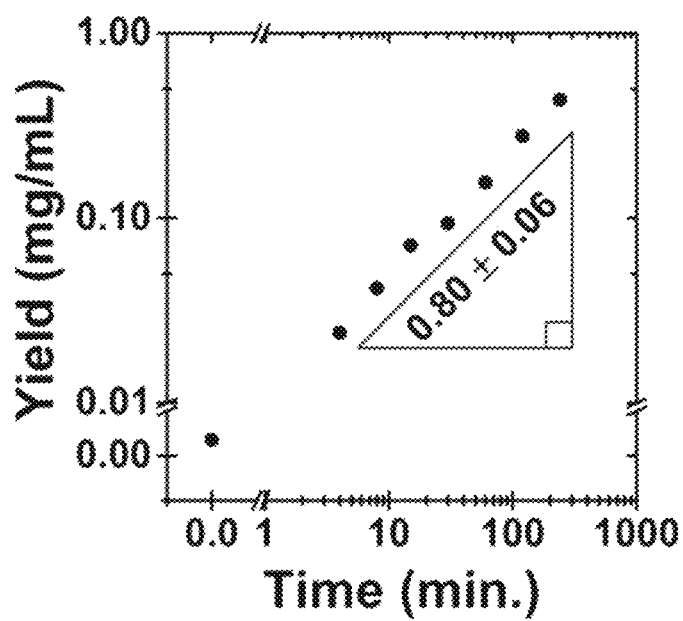

Graphene is exfoliated from natural graphite flakes using a high-shear rotor-stator mixer (Silverson L5M-A) with a square hole high shear screen. Nitrocellulose (NC) (Scientific Polymer, Cat. #714) is dissolved in acetone (Sigma-Aldrich, ACS Reagent Grade) at a concentration of 10 mg/mL. (A typical lab-scale batch contains ~1 L of the exfoliation mixture.) 150 mg/mL of graphite flakes (Asbury Graphite Mills, Grade 3061) is added to the NC solution and shear mixed for 4 hours at 10,230 rpm, with an ice bath employed to cool the mixture. The resulting mixture is then centrifuged (Beckman Coulter Avanti J-26 XPI centrifuge) in two steps, first at 5,000 rpm for 15 minutes, then 6,000 rpm for 20 minutes, to remove large graphite flakes. Following collection of the supernatant, an aqueous salt solution (0.04 g mL$^{-1}$ NaCl, Fisher BioReagents) is added to the supernatant in 78:22 ratio by weight, and centrifuged at 7,500 rpm for 6 minutes to sediment the graphene-NC. The pellet is harvested, washed with de-ionized water, and collected by vacuum-filtration (Millipore Nitrocellulose HAWP 0.45 µm filter paper). The resulting solid is dried and crushed by mortar and pestle to produce a fine graphene/NC powder. The graphene yield is characterized by optical absorption following centrifugation, and increases with the shear mixing time with a power law relation (FIG. 2B). (Note that nitrocellulose with high nitrogen content is highly reactive, and care should be taken in handling the material to mitigate risks.)

Example 2a

Ink Preparation and Deposition.

For inkjet printing, graphene/NC powder is directly dispersed in a solvent system of 75:15:10 ethyl lactate/octyl acetate/ethylene glycol diacetate (Sigma Aldrich) by bath sonication, with a solids loading of 2.3% w/v (~10 mg/mL graphene). (For inkjet printing, graphene concentration can be, without limitation, about 5-about 10 mg/mL or, more generally, about 2-about 20 mg/mL.) Inkjet printing is performed with a Ceradrop X-Serie inkjet printer equipped with a Dimatix 10-pL cartridge (DMC-11610). During printing, the substrate and cartridge nozzle plate are held at 35 and 32° C., respectively.

Example 2b

For spray coating, graphene/NC powder is dispersed in a solvent system of 80:20 acetone/ethyl lactate at a concentration of 5 mg/mL. (Alternatively, for spray coating, graphene concentration can be, without limitation, about 1-about 3 mg/mL or, more generally, as high as about 10-about 20 mg/mL.) Spray coating is carried out with a gravity feed spray gun (TCP Global F3-SET, 1.0 mm nozzle). Spraying is performed at a distance of 15 cm from the substrate, with a pressure of ~200 kPa. The substrate is fixed on a hotplate at 100° C. during coating.

Example 2c

For blade coating, the high viscosity paste is prepared with nominally 10% w/v graphene/NC in ethyl lactate. (Generally, for blade coating, graphene concentration can be, without limitation, about 30-about 60 mg/mL or up to about 80 mg/mL.) Graphene/NC is dispersed in ethyl lactate with excess acetone (~2:1 acetone/ethyl lactate v/v) to aid dispersion by bath sonication. The excess acetone is then removed upon heating to yield the graphene/NC paste. Typical blade coating samples are prepared using Scotch™ tape to mask the film area. Substrates used in this study include glass slides and polyimide foils (DuPont Kapton® FPC, 125 µm thickness). Following deposition, samples are annealed in a tube furnace (Thermo Scientific, Lindberg Blue M).

Example 3

Characterization.

Electrical conductivity measurements are based on an in-line 4-point probe measurement of sheet resistance, with appropriate geometric correction factors, and film thickness measured by stylus profilometry (blade-coated samples are used for these measurements). For bending cycling, samples are bent to a well-defined radius of curvature by sliding around a rigid cylinder using a custom-built setup (spray-coated samples are used for these measurements). For Scotch™ tape testing, tape is applied to the sample and pressed down to uniformly contact the surface before being removed at ~10 mm/s at a ~45° angle.

Figure 2C:
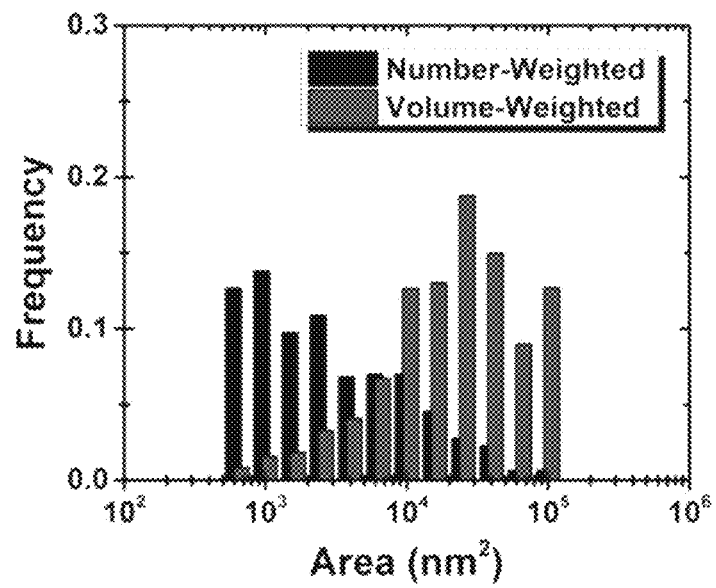
Figure 2D:
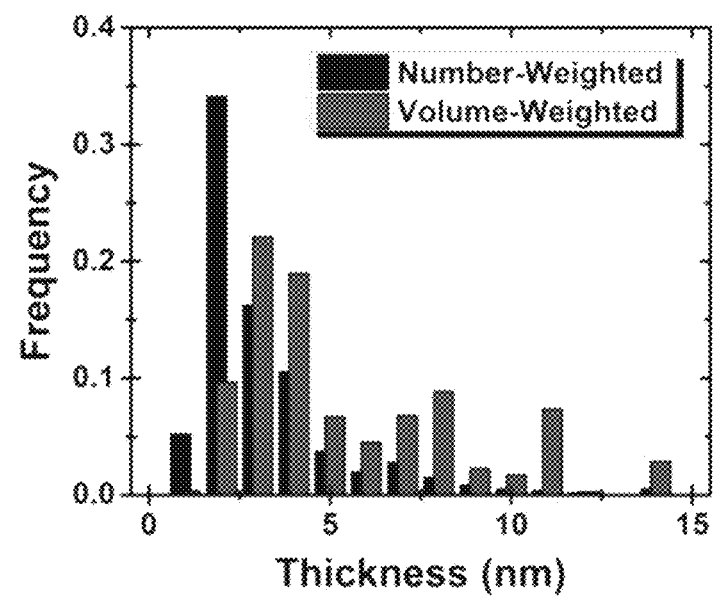

Atomic force microscopy is used to characterize the dimensions of graphene flakes produced by this method. Histograms of flake lateral area and thickness are shown in FIGS. 2C-D. Note that the histograms are shown for both number-weighted (each particle weighted equally) and volume-weighted (particles weighted by relative volume) statistics. While number-weighted distributions are common practice, weighting by volume provides more physically meaningful insight into the properties of inks and resulting thin films.

Figure 5:
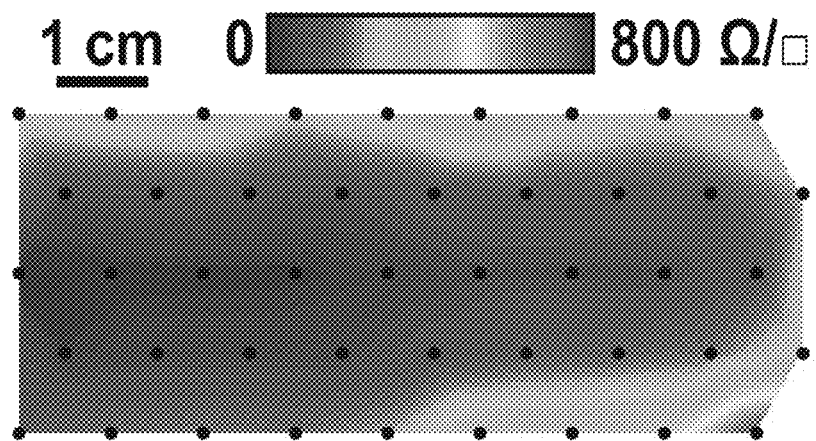
FIG. 5. Sheet resistance map for spray-coated graphene films, showing large-area uniformity.

Additional characterization for deposited patterns (FIG. 3, FIG. 5). FIG. 2 includes characterization of inkjet-printed drops and lines. For completeness, FIG. 3 shows the optical profilometry data from the inset to FIG. 4C, including scale bars and color map.

A key advantage of spray coating is the ability to deposit large-area, uniform films in a non-contact method. FIG. 5 shows a map of sheet resistance for a spray-coated film, showing uniform properties over several centimeters. In practice, larger areas could be coated by employing relative translation or rotation of the spray nozzle and substrate.

Example 4

Thermal Characterization.

Figure 7A:
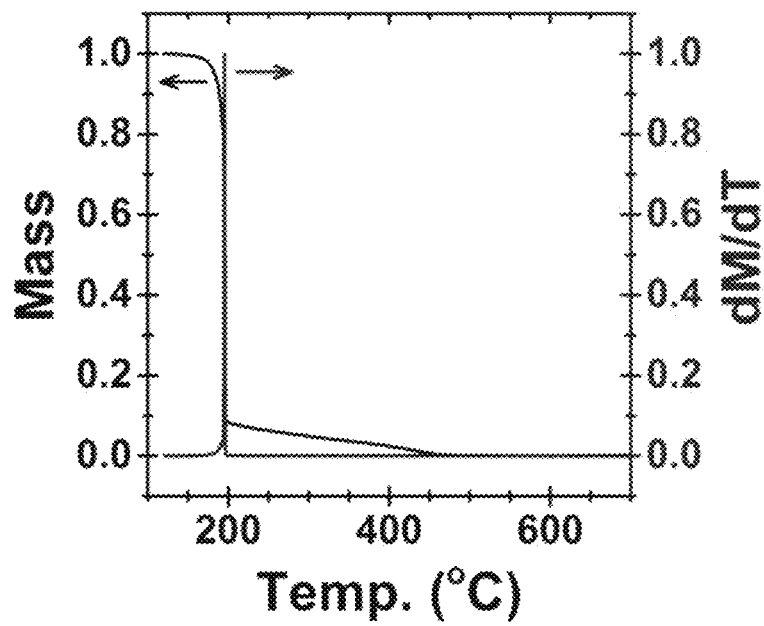
FIGS. 7A-B. TGA results for (A) pure nitrocellulose (B) graphene/NC composite, upon heating in air with a 5° C./min temperature ramp.
Figure 7B:
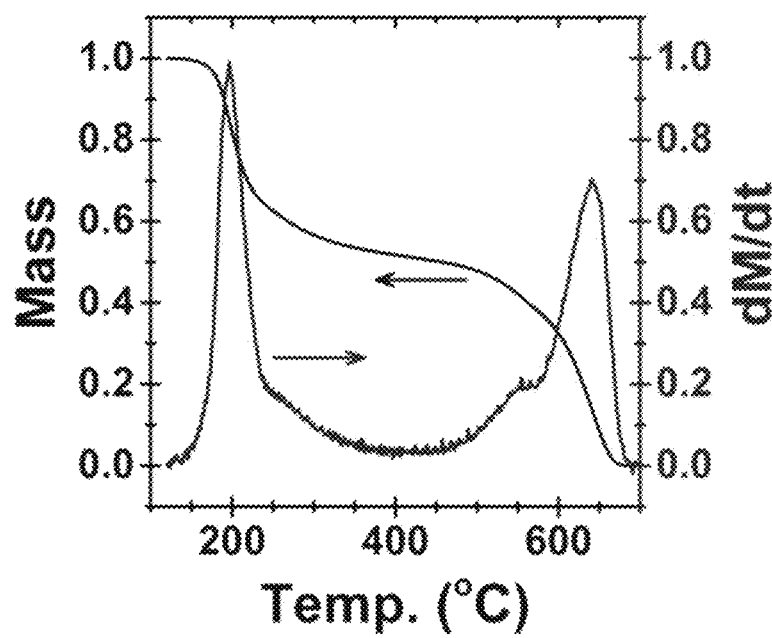

The thermal properties of the dispersant, nitrocellulose, have a significant impact on the properties of graphene films. In particular, thermal annealing is carried out to at least partially decompose the polymer stabilizer. FIG. 7 shows TGA data for the nitrocellulose used in this study. Important characteristics include the sharp decomposition peak at ~200° C., and the remaining residue (~10% wt.) that is slowly burned off up to 450° C. These thermal properties are a key factor in selecting nitrocellulose as a dispersant for this study. (For ease of reference, the TGA results for the graphene/NC composite, shown in FIG. 6A, are reproduced in FIG. 7.)

Example 5

Thickness Evolution with Annealing.

Figure 11:
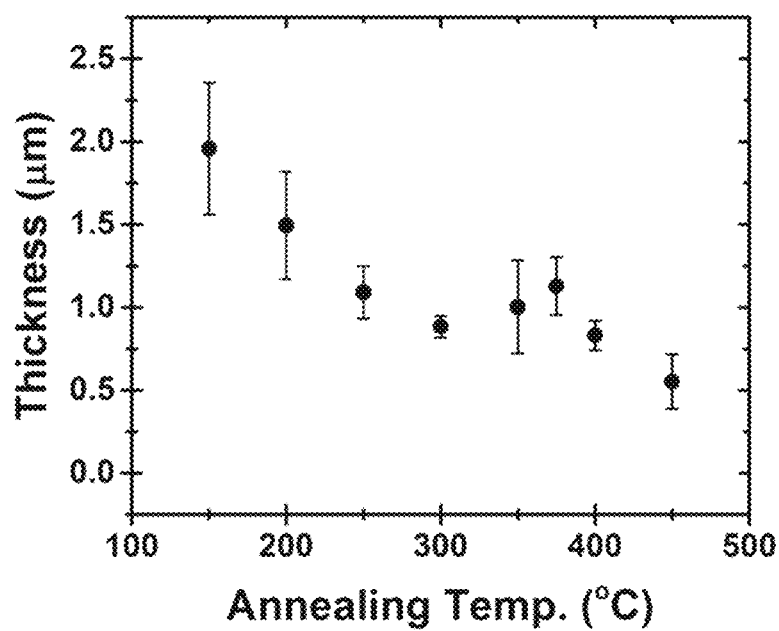
FIG. 11. Thickness of graphene/nitrocellulose films following annealing at different conditions.

During annealing of the films, the nitrocellulose binder is decomposed, allowing the graphene flakes to form a dense structure as shown in FIGS. 6E-F. FIG. 11 shows the thickness of graphene/NC films following heating to 150-450° C. The primary decrease in thickness from 150-250° C. is correlated with the NC decomposition peak (FIG. 3), while the reduction in thickness for annealing >400° C. is likely correlated with oxidation of the graphene flakes.

Example 6

Mechanical Testing.

Figure 12A:
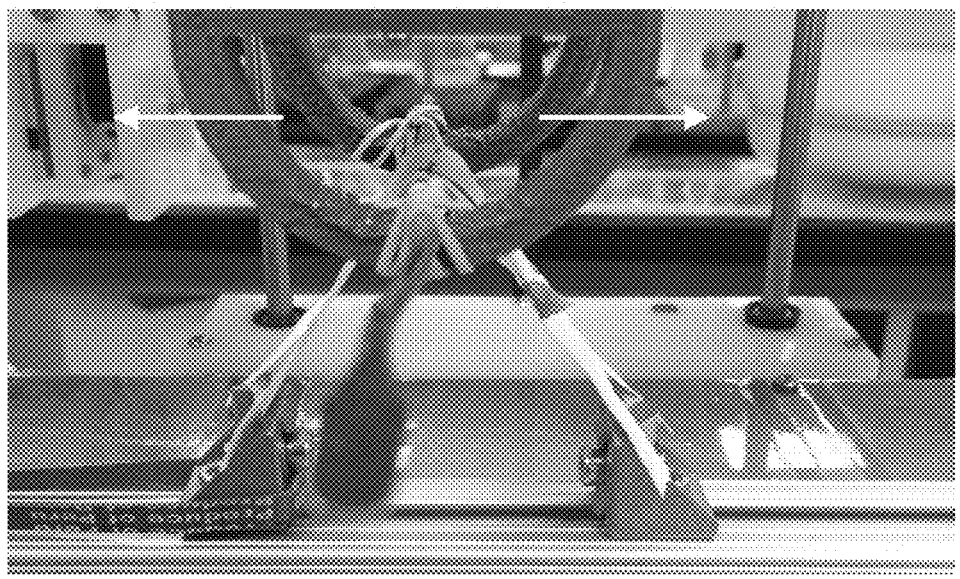
FIGS. 12A-B. Bending test setup (A) and operating principle (B).
Figure 12B:
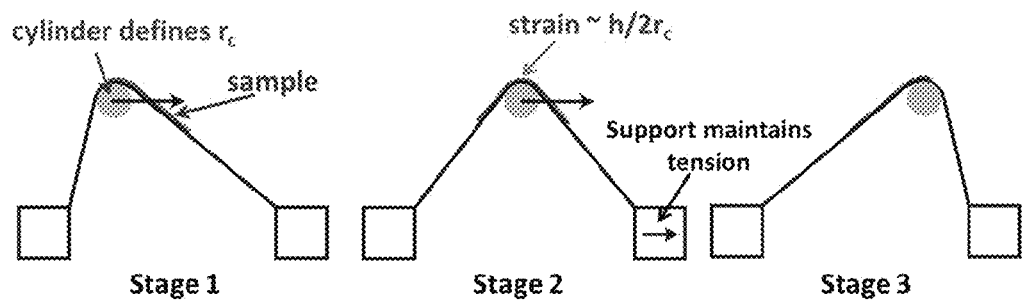

To assess the stability of the graphene patterns to mechanical flexing, the electrical resistance was measured over 2,000 bending cycles. This testing was performed using a home-built automated bending system. The physical setup and operating principle of the bending test are shown in FIG. 12. The sample is folded around a rigid cylinder with a well-defined radius of curvature, which sets the bending strain of the experiment. A motion system is employed to slide the cylinder along the sample, while maintaining tension in the sample so that close contact between the sample and cylinder is maintained. In this way, the entire sample is subject to the bending condition in each cycle, rather than only one location on the sample being repeatedly bent, as is the case in many bending experiments.

For a complementary assessment of mechanical tolerance, samples were subjected to a Scotch™ tape test. The general procedure for this test is shown in FIG. 9. A piece of Scotch™ tape is applied to the sample and pressed down firmly, to ensure good contact with the graphene pattern. It is then removed at a rate of ~10 mm/s and an angle of ~45°. Residue from the sample can be observed on the tape following the test, and the change in resistance is measured to provide quantitative characterization.

The contrast in properties between graphene films processed using the two different cellulose derivatives, ethyl cellulose and nitrocellulose, was further assessed with an ultrasonication test. Films were coated onto glass slides and placed in deionized water in an ultrasonic bath. FIG. 10 shows the degradation of the film under these conditions, for which the primary metric is the proportion of film remaining as a function of time. As is evident in FIG. 10, the graphene film cast from an ink based on ethyl cellulose rapidly degrades, and is completely removed from the glass within ~10 s. In contrast, the graphene/nitrocellulose film is resilient to ultrasonication for over 1 minute. We note that this effect is highly substrate dependent, in that similar films on polyimide show negligible degradation for over 10 minutes under the same conditions.

Example 7

Liquid-Phase Exfoliation and Processing of Graphene.

Graphene was produced by high shear mixing of graphite in a solution of nitrocellulose and acetone, much as described above. Nitrocellulose powder (NC, Scientific Polymer, Cat. #714) was dissolved in acetone at 10 mg/mL (Sigma-Aldrich, ACS Reagent Grade). Flake graphite (Asbury Graphite Mills, Grade 3061) was added at a concentration of 150 mg/mL and shear mixed with a Silverson L5M-A high shear mixer equipped with a square hole screen for 2 hours at 10,230 rpm, using an ice water bath to keep the mixture cool. The resulting mixture was centrifuged to remove unexfoliated graphite flakes at 5,000 rpm for 15 minutes followed by 6,000 rpm for 20 minutes (Beckman Coulter Avanti J-26 XPI centrifuge). The supernatant was collected and mixed with salt water (0.04 g/mL NaCl, Fisher BioReagents, in deionized water) in a ratio of ~3:1 w/w, then centrifuged at 7,500 rpm for 6 minutes to sediment the graphene/NC composite. This composite was washed with deionized water and dried to yield a fine black powder containing graphene and NC. (Again, it should be noted that nitrocellulose with high nitrogen content is highly reactive, and thus care should be taken in handling the material to mitigate risks.)

Example 8

Ink Formulation and Printing.

Graphene/NC powder was directly dispersed in ethyl lactate at a concentration of 8% w/v using bath sonication to prepare DIW inks. For DIW printing, a HyRel System 30M 3D printer was used, with a 200 μm diameter extrusion tip. For multilayer printing, the print bed was held at 60° C. to accelerate drying. Plastic and glass substrates were cleaned with ethanol prior to printing.

Example 9

Intense Pulsed Light Annealing.

Photonic annealing was performed using a Xenon Sinteron 2010 with a spiral lamp geometry. Pulse energies of 0-7 J/cm$^2$ were estimated based on calibration data from the manufacturer. For all photonic annealing experiments, the sample was held a distance of 25 mm from the lamp, and annealing was performed with a single light pulse. For thermal annealing reference samples, the optimized annealing conditions (350° C. for 30 minutes) were used as described above.

Example 10

Chemical and Structural Characterization.

All electrical measurements were collected using a Keithley source meter. Film samples were characterized using an in-line 4-point probe measurement system, taking into account appropriate geometric correction factors. Raman spectra were obtained using a Horiba Xplora Raman microscope equipped with a 532 nm laser. Peak intensity ratios (FIG. 17C) indicate the average and standard deviation of 3 different spectra collected at different points. Note that a low laser power and long integration time were employed to avoid altering the sample from local heating. XPS was collected with a Thermo Scientific ESCALAB 250Xi system, and SEM images were collected using a Hitachi SU8030 SEM.

Example 11

Microsupercapacitor Fabrication and Testing.

For microsupercapacitor fabrication, a HyRel 3D System 30M printer was used to print graphene interdigitated electrodes. Following electrode annealing, a gel electrolyte was applied that contained 1.0 g phosphoric acid, 1.0 g PVA ($M_w$=50,000, Aldrich), 3.0 g IPA, and 6.0 g water, similar to that reported previously in the literature (see, Li, L.; Secor, E. B.; Chen, K.; Zhu, J.; Liu, X.; Gao, T. Z.; Seo, J. T.; Zhao, Y.; Hersam, M. C. High-Performance Solid-State Supercapacitors and Microsupercapacitors Derived from Printable Graphene Inks. *Adv. Energy Mater.* 2016, 6, 1600909, the entirety of which is incorporated herein by reference). The samples were then dried overnight and tested by cyclic voltammetry and chronopotentiometry using a CHI 760D potentiostat.

Example 12

Differential Scanning Calorimetry.

Differential scanning calorimetry (DSC) was used to characterize the annealing properties of graphene/nitrocellulose (NC) and graphene/ethyl cellulose (EC) powders. As shown in FIG. 13B, graphene/NC shows a strong exothermic peak at ~200° C. corresponding to NC decomposition. The corresponding data for graphene/EC is shown in FIG. 14. Notably, the decomposition of EC under these conditions exhibits an endothermic peak. This difference in built-in energy for EC and NC leads to a dramatic contrast in photonic annealing characteristics.

Example 13

Scanning Electron Microscopy.

Figure 15A:
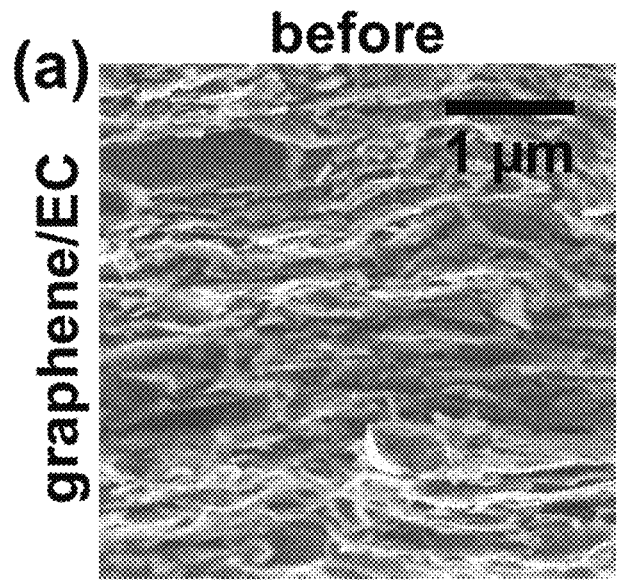
FIGS. 15A-D. Microstructural characterization of graphene films. (A,B) Cross sectional SEM images of graphene/EC films before and after exposure to pulsed light annealing, respectively, showing minimal change in microstructure and thus ineffective annealing. (C,D) Corresponding images for graphene/NC films, showing the evolution from a dense, polymer-rich microstructure to a porous, annealed film.
Figure 15B:
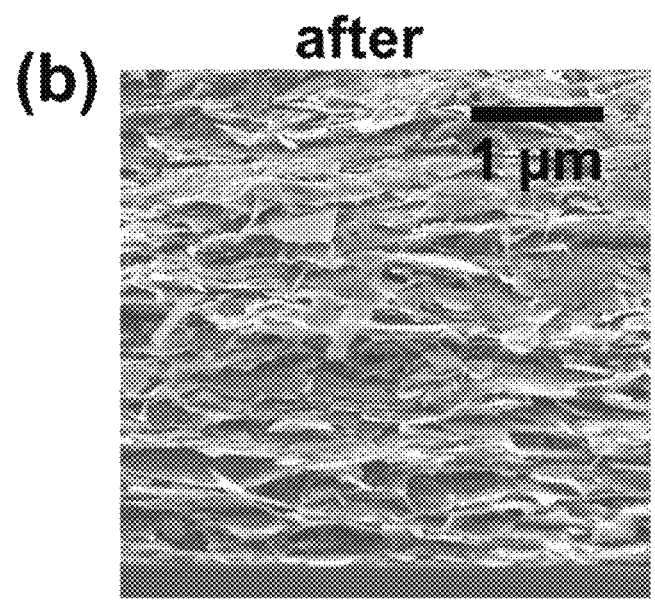
Figure 15C:
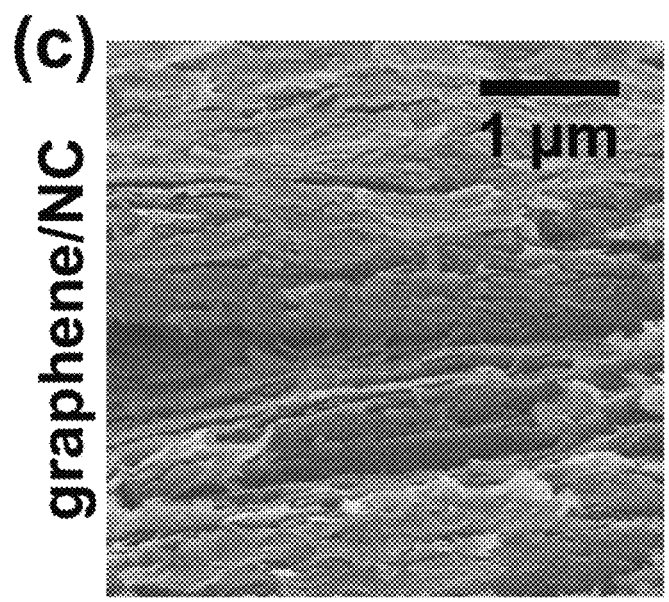
Figure 15D:
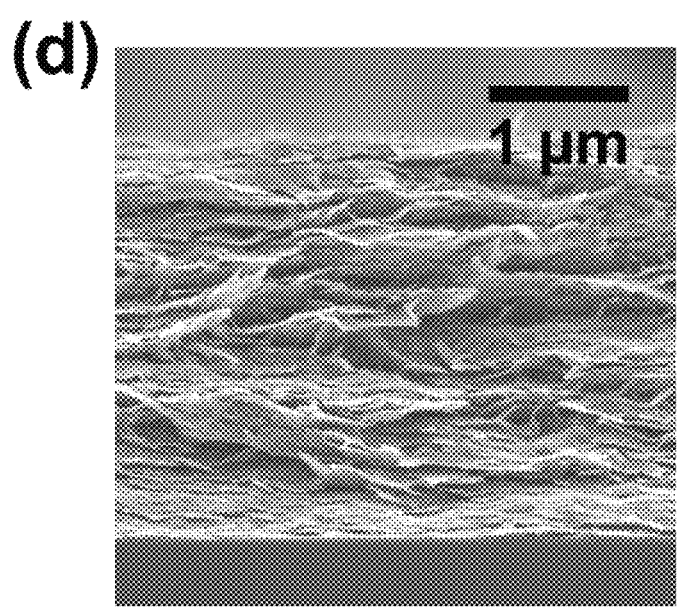

Photonic annealing of graphene/EC and graphene/NC films was performed using silicon substrates to act as an effective heat sink. Due to its high thermal conductivity and thermal mass, silicon traditionally suppresses photonic annealing. This effect is seen for graphene/EC as shown in FIGS. 15A-B before and after light exposure, respectively. In particular, no change is observed in the film microstructure. In contrast, the corresponding SEM images of graphene/NC provided in FIGS. 15C-D reveal a distinct change in film microstructure. Notably, the film is dense and polymer-rich prior to annealing, but after light exposure only a small region at the film-substrate interface remains dense. The remainder shows increased porosity, resulting from the rapid release of volatile reaction products upon NC decomposition.

Example 14

Chemical Characterization.

Figure 17A:
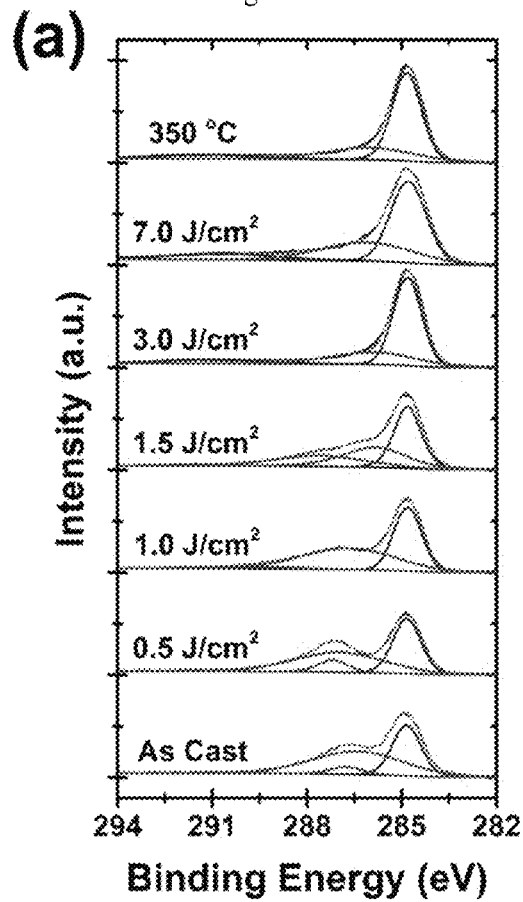
FIGS. 17A-C. Chemical characterization of graphene/NC as a function of annealing conditions. (A) XPS C1s spectra for graphene/NC films following different post-treatment conditions. (B) Representative Raman spectra for different photonic annealing conditions. (C) $I_D/I_G$ ratio following annealing on various substrates, showing a consistent reduction following photonic annealing.

X-ray photoelectron spectroscopy (XPS) and Raman spectroscopy were performed to study the effect of annealing on film chemistry. FIG. 17A shows XPS C1s data for graphene/NC films as-cast, thermally annealed to 350° C., and photonically annealed with varying pulse energies. The as-cast film shows the presence of C—O functionality associated with the ether linkages of cellulose derivatives as peaks above 386 eV, along with sp$^2$ C—C associated with the graphene flakes (~285 eV). Following photonic annealing, the spectra show minimal evolution for pulse energies below 1.5 J/cm$^2$. A discrete change in the spectra is observed at higher energy annealing, resulting in a C1s spectrum largely consistent with thermal annealing at 350° C. This discrete transition in the film composition supports the notion of a propagating reaction. In particular, once enough energy is added to initiate the exothermic decomposition of NC, the reaction propagates through the film to result in complete annealing.

Figure 17B:
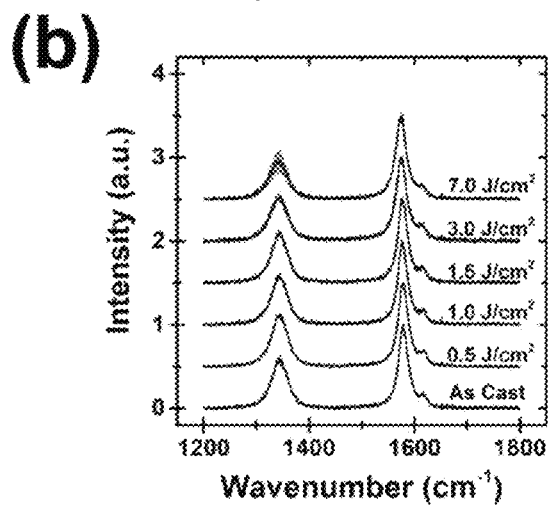
Figure 17C:
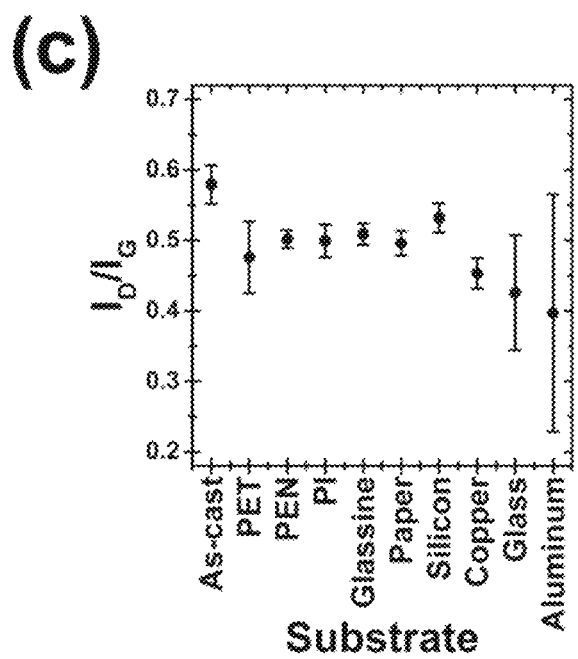

FIG. 17B shows representative Raman spectra for graphene/NC films before and after photonic annealing. These spectra show the characteristic D, G, and D' peaks for graphene, with a slight reduction in the $I_D/I_G$ ratio following photonic annealing, indicating that the process does not damage the graphene flakes. This reduction is observed for films on a wide range of substrates, including PET, PEN, PI and glassine paper (FIG. 17C). Moreover, due to the built-in energy of NC, annealing can be performed on substrates that act as effective heat sinks, such as silicon, copper, and aluminum.

Example 15

Electrical Characterization.

Four-point probe measurements were used to assess the sheet resistance of annealed graphene films. FIG. 19 shows the sheet resistance of photonically annealed films normalized to a thermal annealing control as a function of annealing energy. The sheet resistance of graphene/NC drops sharply following annealing at 1.5 J/cm$^2$, which corresponds to the decomposition threshold of NC observed by chemical characterization. The sharpness of the transition can be attributed to the propagating nature of NC decomposition, wherein a light pulse with sufficient energy to initiate decomposition leads to a fully annealed film. Additionally, the sheet resistances after photonic annealing for graphene/NC are comparable to those obtained by thermal annealing. Graphene/EC, on the other hand, exhibits a gradual decrease in sheet resistance as a function of annealing energy.

Overall, the present invention demonstrates a promising nitrocellulose-based platform for solution-processed graphene with excellent versatility and functional properties. This strategy combines scalable, low-cost production of graphene with tunable ink formulation for a range of liquid-phase coating and patterning techniques compatible with either thermal or photonic annealing, enhancing the opportunities for broad integration in real-world applications. Moreover, the resulting graphene patterns exhibit a suite of desirable properties such as electrical conductivity of ~40,000 S/m that is among the highest for solution-processed carbon nanomaterials. In addition, the graphene/nitrocellulose patterns are resilient to a range of mechanical and environmental stresses including cyclic bending, Scotch™ tape testing, and damp heat aging. The concurrent realization of these properties in a scalable and adaptable process represents a significant advance for the incorporation of graphene inks in flexible printed electronics.

We claim:

1. A method of graphene ink deposition, said method comprising:
   providing a graphene ink composition comprising graphene, a nitrocellulose and an ink solvent;
   depositing said graphene ink composition on a substrate; and
   annealing said deposited graphene ink composition, said graphene ink annealation product comprising graphene and amorphous carbon.

2. The method of claim 1 wherein said ink solvent comprises a component selected from C2-C8 alkyl esters, alkylene glycols, alkylene glycol ethers, alkylene glycol acetates, ketones and combinations thereof.

3. The method of claim 1 wherein said deposition is selected from inkjet printing, spray coating and blade coating.

4. The method of claim 3 wherein said ink solvent is selected for a said deposition.

5. The method of claim 4 wherein said deposition is inkjet printing, and said ink solvent comprises ethyl lactate, octyl lactate and ethylene glycol diacetate.

6. The method of claim 4 wherein said deposition is spray coating, and said ink solvent comprises acetone and ethyl lactate.

7. The method of claim 4 wherein said deposition is blade coating, and said ink solvent comprises ethyl lactate.

8. The method of claim 1 wherein said deposition is on a flexible polymeric substrate.

9. The method of claim 1 wherein said deposited graphene ink composition is photonically annealed.

10. The method of claim 9 wherein said deposition is on a substrate selected from glass, metal, metal oxide, paper and flexible polymeric substrates.

11. The method of claim 1 wherein provision of said ink composition comprises:
    exfoliating a graphene source material with a medium comprising an organic solvent at least partially miscible with water and a nitrocellulose dispersing agent at least partially soluble in said organic solvent;
    contacting at least a portion of said exfoliated graphene medium with an aqueous medium to concentrate exfoliated graphene in a solid composition comprising graphene and a said nitrocellulose;
    isolating said solid composition from said media; and
    contacting said graphene composition with an ink solvent.

12. A method of using nitrocellulose to modulate properties of a graphene ink printed on a substrate, said method comprising:
    providing a graphene ink composition comprising graphene, a nitrocellulose and an ink solvent;
    printing said graphene ink composition on a substrate; and
    annealing said printed graphene ink composition to decompose said nitrocellulose, thereby providing amorphous carbon and modulating at least one of physical, mechanical and conductive properties of said graphene ink print.

13. The method of claim 12 wherein said amorphous carbon modulates coupling of graphene flakes.

14. The method of claim 12 wherein said amorphous carbon modulates adhesion of said graphene ink print to said substrate.

15. The method of claim 12 wherein said graphene ink composition is printed on a flexible polymeric substrate.

16. The method of claim 12 wherein said ink solvent comprises a component selected from C2-C8 alkyl esters, alkylene glycols, alkylene glycol ethers, alkylene glycol acetates, ketones and combinations thereof.

17. The method of claim 12 wherein said graphene ink composition is annealed at about 200° to about 350° C.

18. The method of claim 17 wherein said graphene ink composition is annealed at 200° C.

19. The method of claim 12 wherein said deposited graphene ink composition is photonically annealed.

20. The method of claim 19 wherein said photonic annealing increases the surface area of said graphene ink print.

21. The method of claim 20 wherein said graphene ink print comprises a porous morphology.

22. The method of claim 19 wherein said substrate is of a microsupercapacitor device, and said printing provides interdigitated graphene electrodes on said substrate.

23. The method of claim 22 wherein said photonic annealing increases capacitance of said device.

24. The method of claim 23 wherein the capacitance of said device increases with increasing thickness dimension of said graphene ink print.

25. A graphene ink composition comprising graphene, a nitrocellulose and an ink solvent, wherein said graphene ink composition is annealed to provide a graphene ink composition comprising graphene and amorphous carbon.

26. The composition of claim 25 wherein said ink solvent comprises a component selected from C2-C8 alkyl esters, alkylene glycols, alkylene glycol ethers, alkylene glycol acetates, ketones and combinations thereof.

27. The composition of claim 25 comprising a graphene concentration of about 1 mg/ml-about 80 mg/ml.

28. The composition of claim 25 comprising a nitrocellulose concentration of about 5 mg/ml-about 15 mg/ml.

29. A composite comprising a graphene ink composition of claim 25 coupled to a flexible polymeric substrate.

30. The composite of claim 29 wherein said substrate comprises a polyimide film.

31. The composite of claim 29 wherein said graphene ink composition is photonically annealed.

32. The composite of claim 31, wherein said composite is of a microsupercapacitor, and said graphene ink composition provides interdigitated graphene electrodes on said substrate.

33. A graphene ink composition comprising graphene, a nitrocellulose and an ink solvent, said nitrocellulose capable of exothermic decomposition, gaseous evolution upon said decomposition and providing said graphene ink composition a porous microstructure upon said gaseous evolution.

34. The composition of claim 33 wherein said ink solvent comprises a component selected from C2-C8 alkyl esters, alkylene glycols, alkylene glycol ethers, alkylene glycol acetates, ketones and combinations thereof.

35. The composition of claim 33 comprising a graphene concentration of about 1 mg/ml-about 80 mg/ml.

36. The composition of claim 33 comprising a nitrocellulose concentration of about 5 mg/ml-about 15 mg/ml.

37. A composite comprising a graphene ink composition of claim 33 coupled to a flexible polymeric substrate.

38. The composite of claim 37 wherein said substrate comprises a polyimide film.

39. The composite of claim 37 wherein said graphene ink composition is annealed to provide a graphene ink composition comprising graphene and amorphous carbon.

40. The composite of claim 39 wherein said graphene ink composition is photonically annealed.

41. The composite of claim 40, wherein said composite is of a microsupercapacitor, and said graphene ink composition provides interdigitated graphene electrodes on said substrate.

\* \* \* \* \*